(12) United States Patent
Sendai et al.

(10) Patent No.: US 6,558,518 B1
(45) Date of Patent: May 6, 2003

(54) METHOD AND APPARATUS FOR PLATING SUBSTRATE AND PLATING FACILITY

(75) Inventors: Satoshi Sendai, Fujisawa (JP); Akihisa Hongo, Yokohama (JP); Kenya Tomioka, Yokohama (JP); Katsumi Tsuda, Kawasaki (JP); Masayuki Kumekawa, Fujisawa (JP); Naoaki Ogure, Tokyo (JP); Kenichi Sasabe, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/612,218

(22) Filed: Jul. 7, 2000

(30) Foreign Application Priority Data

| Jul. 8, 1999 | (JP) | ............................................ 11-194919 |
| Jul. 8, 1999 | (JP) | ............................................ 11-194921 |
| Aug. 12, 1999 | (JP) | ............................................ 11-228898 |
| Aug. 25, 1999 | (JP) | ............................................ 11-238195 |

(51) Int. Cl.$^7$ ................................................ C25B 15/00
(52) U.S. Cl. .................................. 204/224 R; 204/227
(58) Field of Search .............................. 204/224 R, 227

(56) References Cited

U.S. PATENT DOCUMENTS

| 5,222,310 A | | 6/1993 | Thompson et al. |
| 5,224,504 A | | 7/1993 | Thompson et al. |
| 6,123,825 A | * | 9/2000 | Uzoh et al. .................. 205/224 |
| 6,126,761 A | * | 10/2000 | DeHaven et al. ........... 205/224 |
| 6,267,853 B1 | * | 7/2001 | Dordi et al. ................. 204/232 |

FOREIGN PATENT DOCUMENTS

| JP | 62-297494 | 12/1987 |
| JP | 64-39044 | 2/1989 |
| JP | 3-89167 | 9/1991 |

* cited by examiner

*Primary Examiner*—Arun S. Phasge
(74) *Attorney, Agent, or Firm*—Wenderoth, Lind & Ponack, L.L.P.

(57) ABSTRACT

A substrate such as a semiconductor wafer is plated to fill a metal such as copper (Cu) or the like in interconnection grooves defined in the substrate. An apparatus for plating such a substrate has a plating chamber for holding a plating solution, the plating chamber housing an anode that is immersible in the plating solution held by the plating chamber. A plating solution ejector pipe produces an upward jet of plating solution from a plating solution supplied to the plating chamber from an external source, and a substrate holder removably holds a substrate and positions the substrate such that a surface to be plated of the substrate is held in contact with the jet of plating solution. The plating chamber has a plating solution outlet defined in a bottom thereof for discharging a portion of the supplied plating solution via through-holes defined in the anode and/or around the anode out of the plating chamber.

17 Claims, 22 Drawing Sheets

F I G. 6
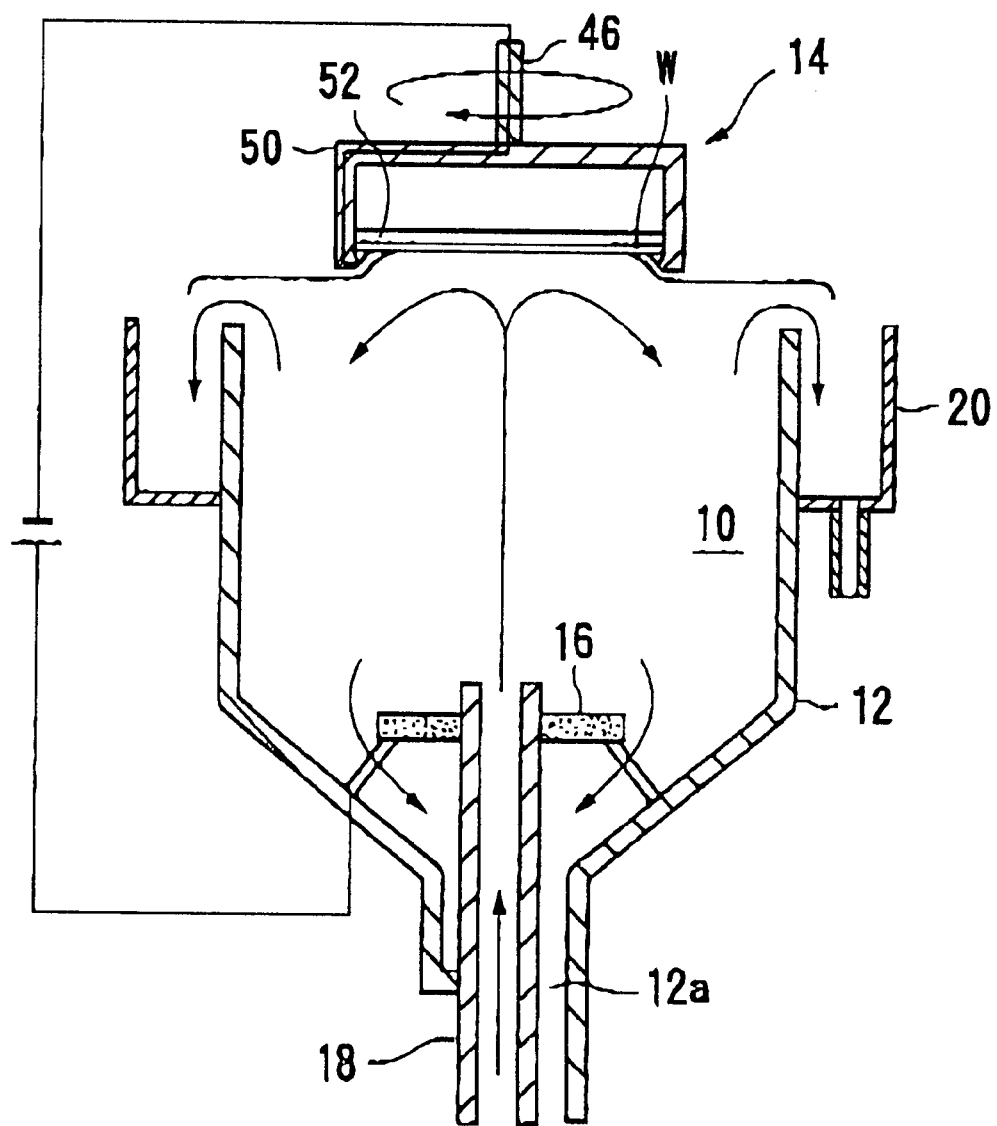

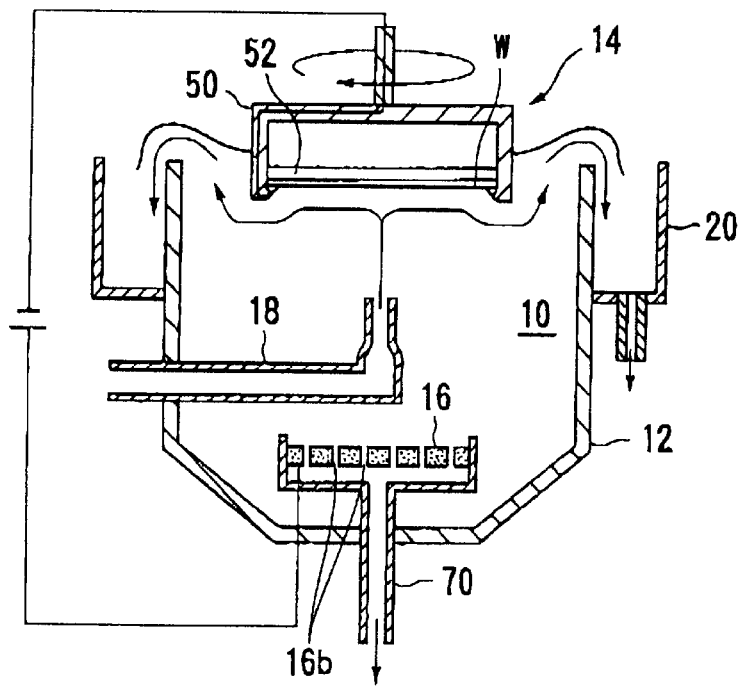
F I G. 11
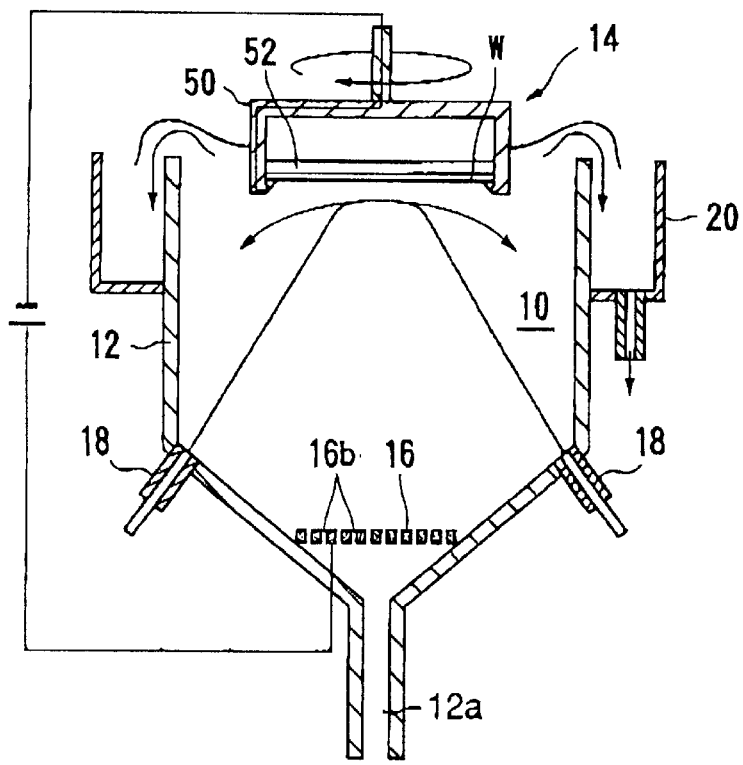
F I G. 12

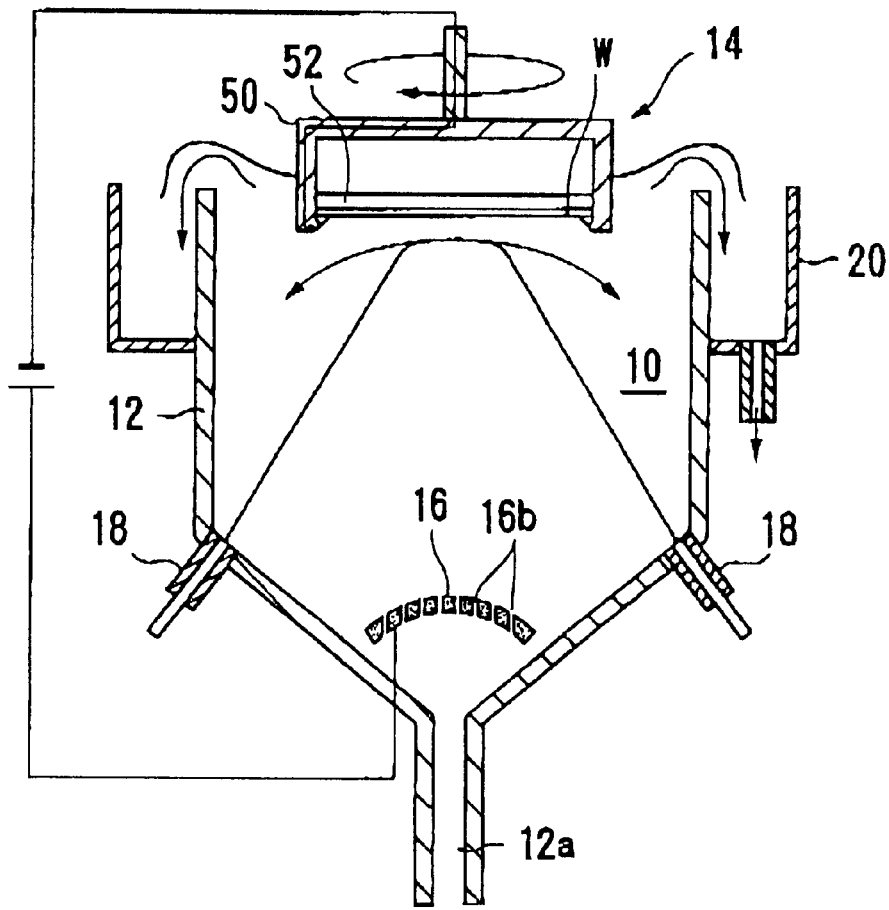
F I G. 13

F I G. 15
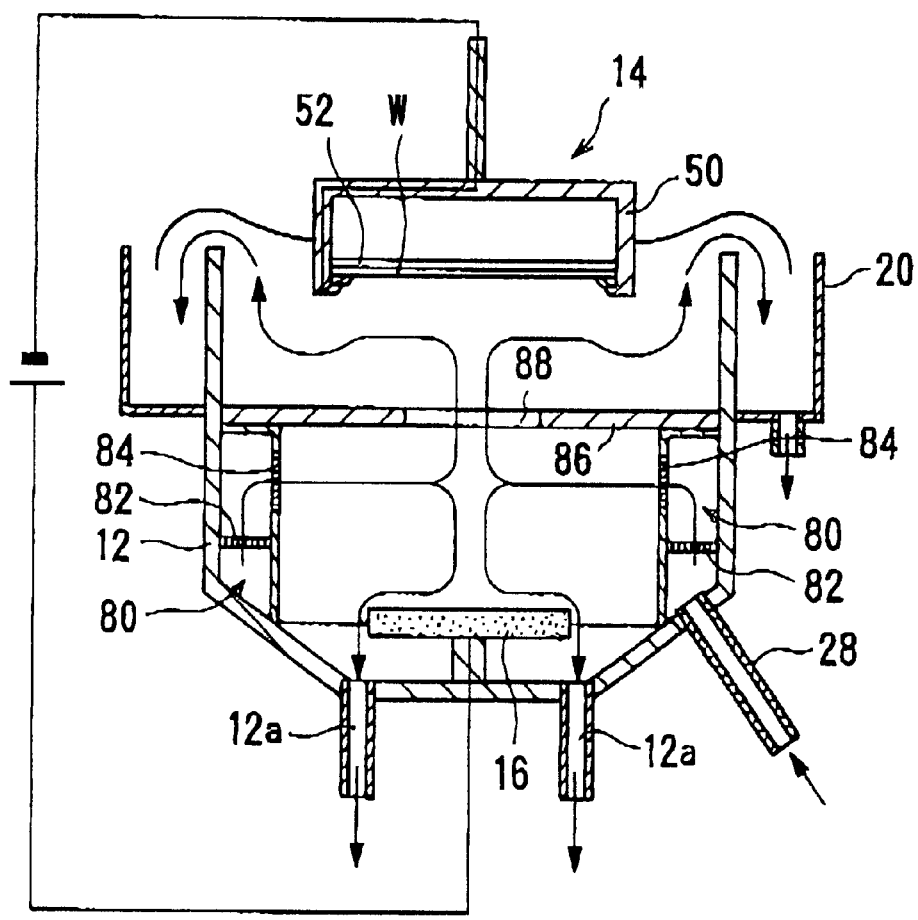

F I G. 16
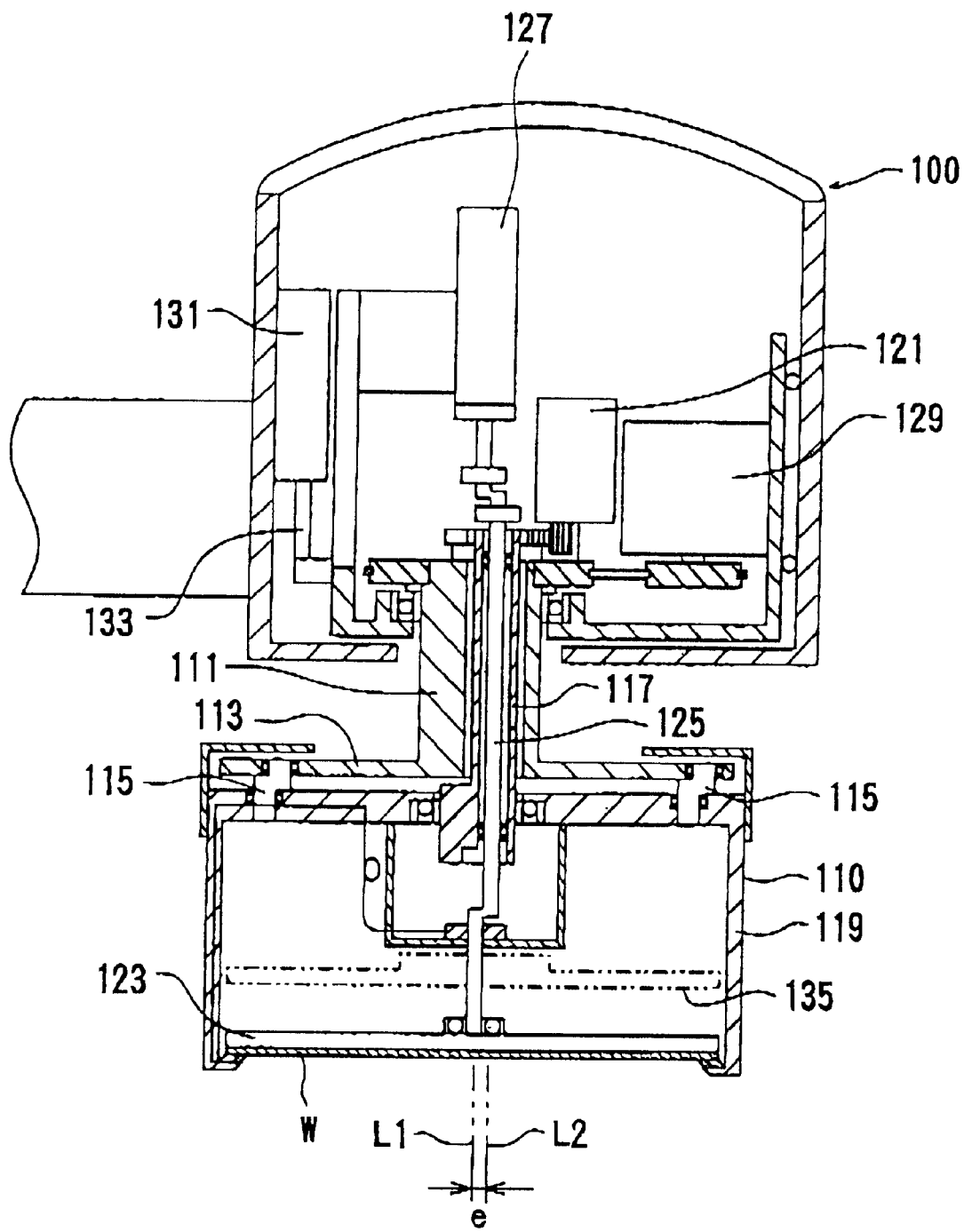

FIG. 17

ST1 — COPPER PLATING

ST2 — CHEMICAL CLEANING AND OUTER CIRCUMFERENTIAL ETCHING

ST3 — PURE WATER CLEANING

ST4 — DRYING

ST5 — ANNEALING

F I G. 18
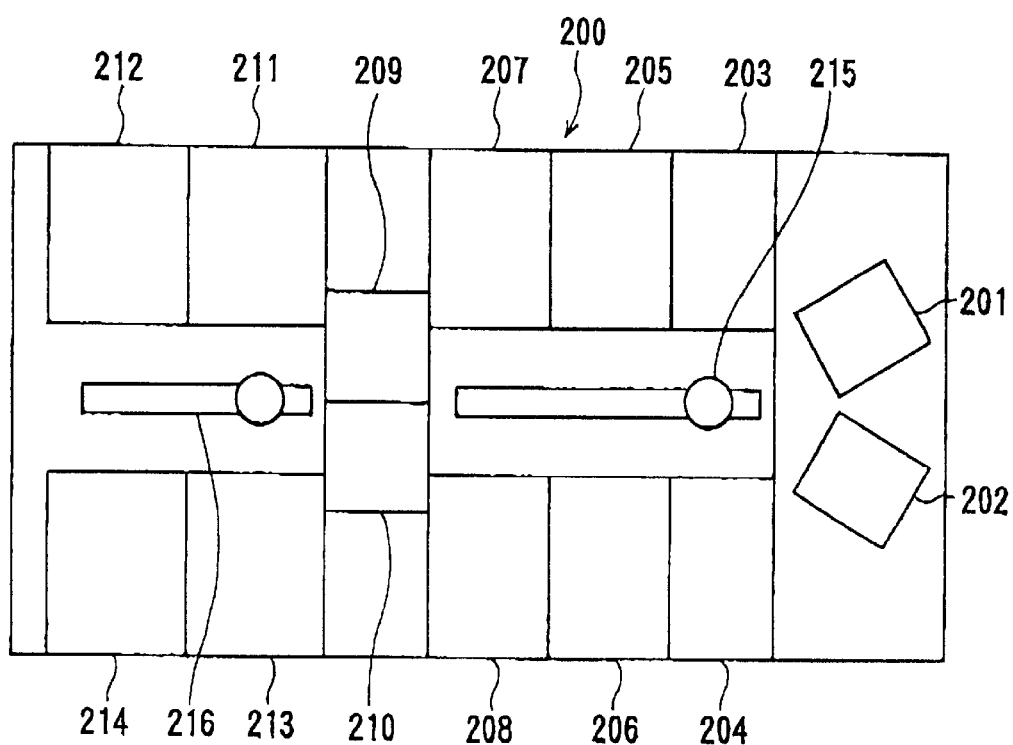

F I G. 25
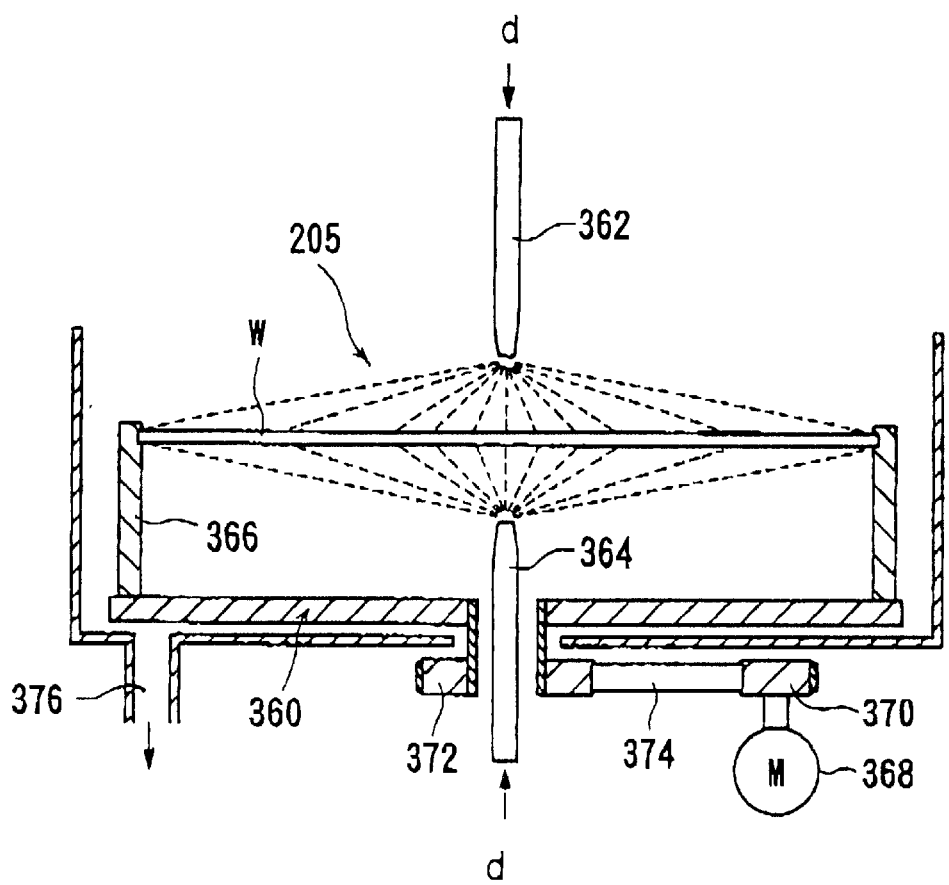

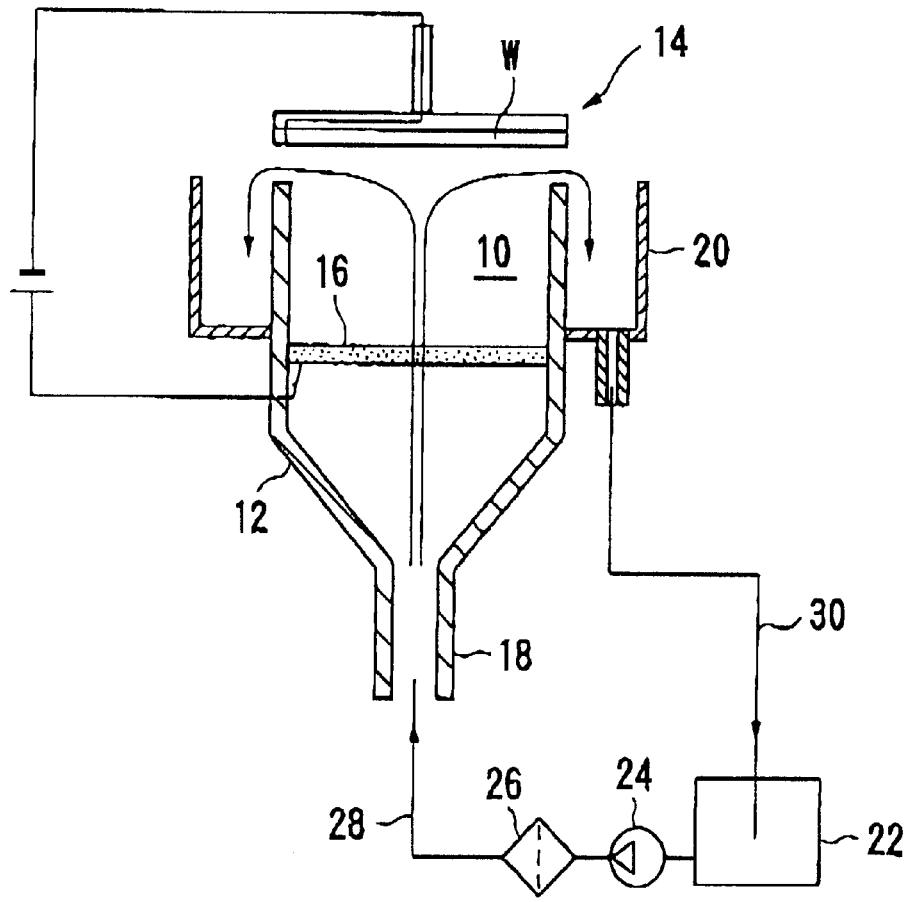
F I G. 29

F I G. 30A
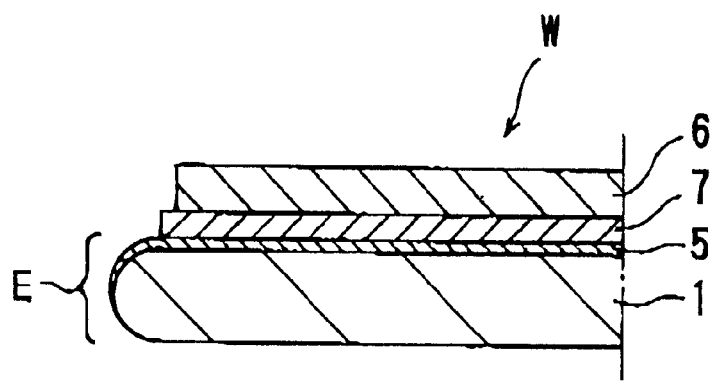
F I G. 30B
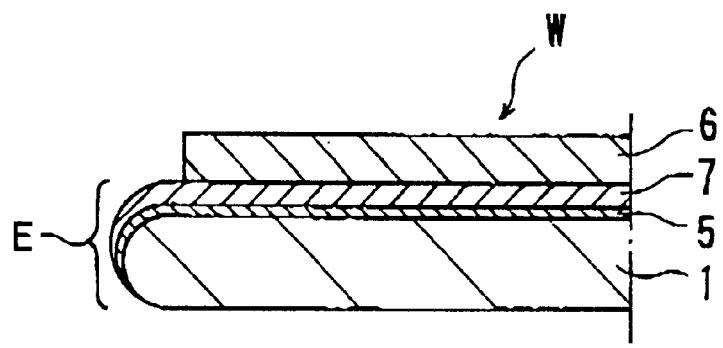

METHOD AND APPARATUS FOR PLATING SUBSTRATE AND PLATING FACILITY

BACKGROUND OF THE INVENTION

1. Field of the Invention

The present invention relates to a method and an apparatus for plating a substrate. More particularly, it relates to a method and an apparatus for plating a substrate such as a semiconductor wafer to fill a metal such as copper (Cu) or the like in interconnection grooves defined in the substrate.

2. Description of the Related Art

In recent years, there has been a growing tendency to use copper, which has low electric resistivity and high electromigration resistance, instead of aluminum or aluminum alloy, as a metal material for forming interconnection circuits on semiconductor substrates. Copper interconnections are generally formed by filling copper in minute grooves or recesses defined in the surface of a semiconductor substrate. Specifically, copper interconnections are formed by depositing a film of copper over the entire surface of the semiconductor substrate according to CVD, sputtering, or plating, and then removing unwanted copper from the surface according to a chemical mechanical polishing (CMP) process, leaving copper in the grooves or recesses.

FIGS. 28A through 28C of the accompanying drawings show successive steps of manufacturing a substrate W with copper interconnections. As shown in FIG. 28A, an oxide film 2 of $SiO_2$ is deposited on a conductive layer 1a on a semiconductor substrate 1 on which semiconductor devices are formed. Then, a contact hole 3 and an interconnection groove 4 are formed in the oxide film 2 by lithography and etching. Thereafter, a barrier layer 5 of TiN or the like and a seed layer 7 as a layer for supplying an electric current for electroplating are successively formed on the surface formed so far.

Then, as shown in FIG. 28B, the entire surface of the substrate W is plated with copper to deposit a copper layer 6 on the entire surface, filling the contact hole 3 and the groove 4 with copper. Thereafter, the copper layer 6 over the oxide film 2 is removed by CMP, making the copper layer 6 in the contact hole 3 and the groove 4 lie flush with the oxide film 2. In this manner, an interconnection made of the copper layer 6 is produced as shown in FIG. 28C.

FIG. 29 of the accompanying drawings shows a conventional general arrangement of a cup type apparatus of the face-down type. The cup type plating apparatus has a cylindrical plating chamber 12 which is open upwardly and holds a plating solution 10 therein, and a substrate holder 14 for removably holding a substrate W such as a semiconductor wafer downwardly and positioning the substrate W in a position close to the upper open end of the plating chamber 12. The plating chamber 12 houses therein a planar anode plate 16 immersed approximately horizontally in the plating solution 10. The substrate W serves as a cathode. The anode plate 16 is made of a porous material or a mesh material.

A plating solution ejector pipe 18 for producing an upward jet of plating solution is connected centrally to the bottom of the plating chamber 12. The plating chamber 12 is surrounded by a plating solution reservoir 20 positioned around an upper portion of the plating chamber 12. The plating solution ejector pipe 18 is connected to a plating solution supply pipe 28 that extends from a plating solution storage tank 22 and has a pump 24 and a filter 26. The plating solution storage tank 22 is connected to a plating solution return pipe 30 extending from the plating solution reservoir 20.

The substrate W is held above the plating chamber 12 by the substrate holder 14. The surface to be plated of the substrate W faces downwardly. While a predetermined voltage is being applied between the anode plate 16 and the substrate W, the plating solution 10 in the plating solution storage tank 22 is ejected upwardly from the bottom of the plating chamber 12 by the pump 24 and applied perpendicularly to the surface to be plated of the substrate W. In this manner, a plating current flows between the anode plate 16 and the substrate W, forming a plated film on the lower surface of the substrate W. At this time, an overflow of the plating solution 10 from the plating chamber 12 is retrieved by the plating solution reservoir 20, and flows therefrom into the plating solution storage tank 22 via the plating solution return pipe 30.

In the conventional cup type plating apparatus, the jet of plating solution flows upwardly through pores or mesh of the anode plate 16 toward the lower surface of the substrate W. If the anode plate 16 comprises a soluble electrode, then peeled fragments of a black film attached to the surface of the anode plate 16 are carried by the plating solution to the lower surface of the substrate W. Those fragments of the black film tend to lower the quality of the plated film. In addition, the plating solution is liable to come into contact with cathode pins which supply an electric power to the substrate W, precipitating the plating metal. When the substrate W is subsequently removed, the plated layer near the cathode pins may possibly be damaged.

For electroplating the surface of a substrate with copper, since copper is likely to be diffused into silicon, a barrier layer of TiN, TaN, or the like is deposited on the surface of the substrate, and a thin copper seed layer deposited on the barrier layer is used as a cathode. However, because no barrier layer is formed on the back and edge of the substrate, it is necessary to prevent the plating solution containing copper from being attached to the back and edge of the substrate. In immersion plating, therefore, the substrate is held by a substrate holder, and the outer peripheral edge of the surface of the substrate is sealed by a seal member so as to prevent the outer peripheral edge and back of the substrate from being wetted by the plating solution. Cathode pins are held in contact with the surface of the substrate in a space which is defined by the substrate holder, the substrate, and the seal member and which is held out of contact with the plating solution.

If the above substrate holder is applied to the jet plating process, then since the periphery of the substrate holder projects downwardly from the lower surface of the substrate, an air layer is created below the surface of the substrate simply when the substrate held by the substrate holder is brought into contact with the plating solution. Therefore, a good plated film cannot be formed on the surface of the substrate.

As shown in FIG. 30A of the accompanying drawings, the barrier layer 5 is formed so as to extend from the surface of a substrate W to an edge E thereof in view of the substrate area utilization efficiency, and the copper seed layer 7 is formed on the surface of the barrier layer 5. If the copper seed layer 7 is deposited to a thickness of 100 nm, for example, by sputtering on the entire surface of the substrate W, then not only a thin copper seed layer is formed on the surface of the substrate W, but also a thin copper seed layer is formed on the edge E of the substrate W, as shown in FIG. 30B of the accompanying drawings. A copper layer 6 is formed on only the surface of the substrate W by sealing the outer peripheral edge of the surface of the substrate W so as not to apply the plating solution to the back of the substrate W, as shown in FIGS. 30A and 30B. Consequently, the thin copper seed layer remains deposited on the edge E and an area near the edge E. The remaining thin copper seed layer tends to be peeled off while the substrate W is being transported or subsequently treated after it has been plated or polished by the CMP process, resulting in cross contamination with copper.

When a plated copper film produced by copper sulfate electroplating is left to stand at room temperature, the plated copper film is annealed, and its resistivity is lowered. The gradient of the resistivity differs depending on the plating conditions, the chemical compositions, and the substrate conditions. The resistivity of the plated copper film is stabilized into a value close to that of a copper bulk when it is left to stand for a period of time ranging from 24 hours to 300 hours after being plated.

The reduction in the resistivity means that the crystal grain of the plated copper film gradually becomes coarse and its volume is reduced slightly. When the plated copper film is polished by the CMP process, the reduction in the volume of the plated copper film must have been stopped. Inasmuch as the period of time in which the reduction in the volume of the plated copper film is stopped differs depending on the plating conditions and the substrate conditions, the plated substrate needs to be left to stand until it is stabilized before the CMP process is performed on the plated substrate.

SUMMARY OF THE INVENTION

It is therefore an object of the present invention to provide a method of and an apparatus for plating a substrate according to a jet plating process while preventing the plated film quality from being lowered due to particles produced by a black film or the like even if a soluble anode is employed.

Another object of the present invention is to provide a method of and an apparatus for plating a substrate in a state free of air bubbles while preventing a plating solution from being attached to cathode pins and also preventing the edge and back of the substrate from being contaminated by a metal.

Still another object of the present invention is to provide a method of and an apparatus for plating a substrate such that a remaining copper layer can fully be removed from an edge of the substrate and an area close thereto. Thus, a copper layer is prevented from being peeled off to cause a cross contamination with copper while the plated substrate is being subsequently polished by a CMP process or transported. The plated substrate can subsequently be polished by the CMP process in a short period of time after the substrate is plated with copper.

According to an aspect of the present invention, there is provided an apparatus for plating a substrate, comprising a plating chamber for holding a plating solution, the plating chamber housing an anode that is immersible in the plating solution held by the plating chamber, a plating solution supply part for supplying the plating solution to the plating chamber from an external source, and a substrate holder for removably holding a substrate and positioning the substrate such that a surface to be plated of the substrate is held in contact with the plating solution. The plating chamber has a plating solution outlet defined in a bottom thereof for discharging a portion of the supplied plating solution out of the plating chamber while the substrate is plated.

Peeled fragments or particles of a black film formed on the anode are discharged together with the plating solution through the plating solution outlet out of the plating chamber, and hence are prevented from being carried and attached to the surface of the substrate to be plated. Other foreign matter attached and deposited on the anode is also prevented from being carried and attached to the surface of the plated film on the substrate.

According to another aspect of the present invention, there is provided an apparatus for plating a substrate, comprising a plating chamber for holding a plating solution. The plating chamber houses an anode that is immersible in the plating solution held by the plating chamber from an external source. A substrate holder removably holds a substrate and positions the substrate such that a surface of the substrate to be plated is held in contact with the plating solution, and the plating solution supply part comprises a plurality of supply members disposed on a side wall or bottom of the plating chamber.

The anode placed in the plating solution is prevented from being directly contacted by the jet of plating solution, and an upward bulge can be formed on the surface of the plating solution. The upward bulge on the surface of the plating solution is effective to remove air bubbles from below the surface to be plated of the substrate when the substrate and the plating solution are brought into contact with each other before the substrate is plated while being immersed in the plating solution.

The supply members are oriented toward a central axis of the plating chamber.

With the supply members being thus oriented, slow swirls are generated in the plating chamber, stabilizing the flow of the plating solution therein. The slow swirls cause the plating solution to flow in the outer circumferential region of the plating chamber, where the plating solution would be slowed down if only the jets were ejected. Thus, the plating solution speed distribution can be improved over the overall surface to be plated of the substrate. In order to rotate the plating solution while forming the upward bulge on the surface of the plating solution, the direction of the jet should pass through a position spaced from the central axis of the plating chamber by a distance smaller than ½ of the radius of the substrate.

The apparatus further comprises a structure for discharging a portion of the supplied plating solution out of the plating chamber through the bottom of the plating chamber.

With the above discharging means, peeled fragments or particles of a black film formed on the anode are discharged together with the plating solution through the plating solution outlet out of the plating chamber, and hence are prevented from being carried and attached to the surface to be plated of the substrate. Other foreign matter attached and deposited on the anode is also prevented from being carried and attached to the surface of the plated film on the substrate.

According to still another aspect of the present invention, there is provided an apparatus for plating a substrate, comprising a plating chamber for holding a plating solution. The plating chamber houses an anode that is immersible in the plating solution held by the plating chamber, and a plating solution supply part supplies the plating solution to the plating chamber from an external source. A substrate holder removably holds a substrate and positions the substrate such that a surface to be plated of the substrate is held in contact with the plating solution. The substrate holder has a vent hole defined in a lower end thereof for removing air bubbles trapped below the surface of the substrate to be plated.

In order to reduce air bubbles trapped by the surface of the substrate to be plated, an outer circumferential portion of the substrate holder which is positioned below the substrate should be as thin as possible. However, because the substrate needs to be sealed in the substrate holder and also needs to be held in close contact with cathode pins in the substrate holder, it is difficult to reduce the thickness of the outer circumferential portion of the substrate holder which is positioned below the substrate, to less than several millimeters. The vent hole defined in the lower end of the substrate holder is effective to remove air bubbles trapped below the surface to be plated of the substrate and hence to prevent air bubbles from being trapped below the surface to be plated of the substrate.

Since a seal member and the cathode pins are disposed on the outer circumferential portion of the substrate holder which is positioned below the substrate, the vent hole cannot be positioned at the same height as the surface to be plated of the substrate. Consequently, the vent hole alone is unable to fully remove air bubbles trapped below the surface to be plated of the substrate. However, when the substrate holder and the substrate are rotated, the flow of the plating solution oriented radially outwardly from the center of the substrate is strengthened to force air bubbles trapped below the surface of the substrate to be plated out of the substrate holder.

According to yet another aspect of the present invention, there is provided an apparatus for plating a substrate, comprising a plating chamber for holding a plating solution. The plating chamber houses an anode that is immersible in the plating solution held by the plating chamber, and a plating solution supply part supplies the plating solution to the plating chamber from an external source. A substrate holder removably holds a substrate and positions the substrate such that a surface to be plated of the substrate is held in contact with the plating solution. An actuator has a rotating mechanism for rotating the substrate holder, and a lifting and lowering mechanism lifts and lowers the substrate holder. A cathode supplies electric power to the substrate, and the cathode does not come in contact with the plating solution.

In the above apparatus, the surface of the substrate to be plated is plated when the substrate holder is lowered by the lifting and lowering mechanism. The substrate is attached to or removed from the substrate holder when the substrate holder is lifted by the lifting and lowering mechanism.

When the substrate held by the substrate holder is lowered while being rotated horizontally, the surface to be plated of the substrate is brought into contact with an upward jet of plating solution in the plating solution in the plating chamber. The area of contact between the substrate and the plating solution is progressively spread outwardly, and at the same time, air bubbles trapped below the surface to be plated of the substrate are discharged from the substrate holder under centrifugal forces upon rotation of the substrate.

According to yet another aspect of the present invention, there is provided an apparatus for plating a substrate, comprising a plating chamber for holding a plating solution. The plating chamber houses an anode that is immersible in the plating solution held by the plating chamber, and a plating solution supply part supplies the plating solution to the plating chamber from an external source. A substrate holder removably holds a substrate and positions the substrate such that a surface of the substrate to be plated is held in contact with the plating solution. A rotating mechanism rotates the substrate holder, and a plating solution draining part discharges a portion of the plating solution out of the plating chamber thereby to lower the surface of the plating solution in the plating chamber, so that the substrate is exposed above the plating solution.

While the substrate held by the substrate holder is rotating, the surface of the plating solution is raised with an upward jet of plating solution being formed in the plating solution. As the surface to be plated of the substrate is brought into contact with the upward jet of plating solution, the area of contact between the substrate and the plating solution is progressively spread outwardly. At the same time, air bubbles trapped below the surface of the substrate to be plated are discharged from the substrate holder under centrifugal forces upon rotation of the substrate.

According to a further aspect of the present invention, there is provided a plating facility comprising a plating unit for plating a surface of a substrate having interconnection grooves and holes defined therein. An etching unit etches away, with a chemical solution, a seed film and/or a thin plated film on an outer circumferential edge of the substrate after the substrate is plated by the plating unit.

With the above arrangement, a seed film and/or a thin plated film on the outer circumferential edge of the substrate after the substrate is plated by the plating unit can be removed. Therefore, the substrate is free of a cross contamination with copper due to the film being peeled off while the plated substrate is being subsequently polished by a CMP process or transported.

The etching unit has a cleaning mechanism for simultaneously cleaning opposite surfaces of the substrate.

After the plated film is etched away from the outer circumferential edge of the substrate, the opposite surfaces of the substrate are simultaneously cleaned to remove plated film residuals that are etched.

According to a still further aspect of the present invention, there is provided a plating facility comprising a plating unit for plating a surface of a substrate having interconnection grooves and holes defined therein. A cleaning unit cleans the substrate after the substrate is plated by the plating unit, and an annealing unit heats the substrate thereby to anneal the substrate after the substrate is cleaned by the cleaning unit.

The substrate which has been plated by the plating unit and then cleaned by the cleaning unit is forcibly annealed by being heated by the heating unit. Therefore, the substrate can be polished by a CMP process without having to be left to stand until the plated film is stabilized.

The above plating facility further comprises an etching unit disposed between the plating unit and the cleaning unit, for etching away, with a chemical solution, a seed film and/or a thin plated film on an outer circumferential edge of the substrate after the substrate is plated by the plating unit. The annealing unit comprises means for annealing one substrate at a time.

According to a yet further aspect of the present invention, there is provided a method for plating a substrate, comprising the steps of producing a jet of plating solution in a plating solution contained in a plating chamber. The surface of the plating solution is brought into contact with a surface to be plated of a substrate held by a substrate holder, for thereby plating the substrate, and a portion of the plating solution is discharged out of the plating chamber.

According to still a further aspect of the present invention, there is provided a method of plating a substrate, comprising the steps of producing a jet of plating solution in a plating solution contained in a plating chamber. The surface of the plating solution is brought into contact with a surface to be plated of a substrate held by a substrate holder, and the substrate is rotated and the relative positions of the substrate and the plating solution are changed until the substrate is immersed in the plating solution, thereby to place the substrate in the plating solution.

The above method further comprises the step of lowering the substrate at a speed of at most 30 mm/second after the surface to be plated of the substrate has contacted the surface of the plating solution. The above step provides a sufficient period of time to discharge air bubbles trapped below the surface of the substrate to be plated out of the substrate holder.

The above method further comprises the steps of increasing the amount of the jet of plating solution until the surface to be plated of the substrate contacts the surface of the plating solution. The amount of the jet of plating solution is reduced after the surface to be plated of the substrate has contacted the surface of the plating solution. The above steps are effective to intensify an upward bulge on the surface of the plating solution until the surface to be plated of the substrate contacts the surface of the plating solution. If the jet of plating solution is too strong, then it tends to de-stabilize a black film formed on an anode, increasing peeled fragments or particles of the black film. Therefore, the amount of the jet of plating solution is reduced to a suitable level.

The above method further comprises the steps of exposing the substrate and the substrate holder above the surface of the plating solution after the substrate has been plated in the plating solution, and rotating the substrate holder at a speed of at least 500 rotations per minute to spin off the plating solution from the substrate. Since the substrate held by the substrate holder is rotated at the high speed, it can spin off the remaining plating solution. Thereafter, the substrate can be delivered to a next process by a robot arm or the like.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 6 is a cross-sectional view showing the manner in which a plating solution is brought into contact with a surface of the substrate to be plated in the plating apparatus shown in FIG. 1;

FIG. 11 is a sectional front elevational view of a plating apparatus according to a third embodiment of the present invention;

FIG. 12 is a sectional front elevational view of a plating apparatus according to a fourth embodiment of the present invention;

FIG. 13 is a sectional front elevational view of a plating apparatus according to a fifth embodiment of the present invention;

FIG. 15 is a sectional front elevational view of a plating apparatus according to a seventh embodiment of the present invention;

FIG. 16 is a cross-sectional view of a mechanism for translating and rotating a substrate;

FIG. 17 is a flowchart of a plating process carried out by a plating facility according to an embodiment of the present invention;

FIG. 18 is a schematic plan view showing a layout of various processing units of the plating facility;

FIG. 25 is a cross-sectional view of a pure water cleaning and drying unit of the plating facility shown in FIG. 18;

FIG. 29 is a sectional front elevational view of a conventional plating apparatus;

FIG. 30A is an enlarged fragmentary cross-sectional view of a substrate with a copper seed layer and a copper layer formed thereon in an ideal pattern; and FIG. 30B is an enlarged fragmentary cross-sectional view of a substrate with a copper seed layer and a copper layer formed thereon in an actual pattern.

DETAILED DESCRIPTION OF THE PREFERRED EMBODIMENTS

Figure 1:
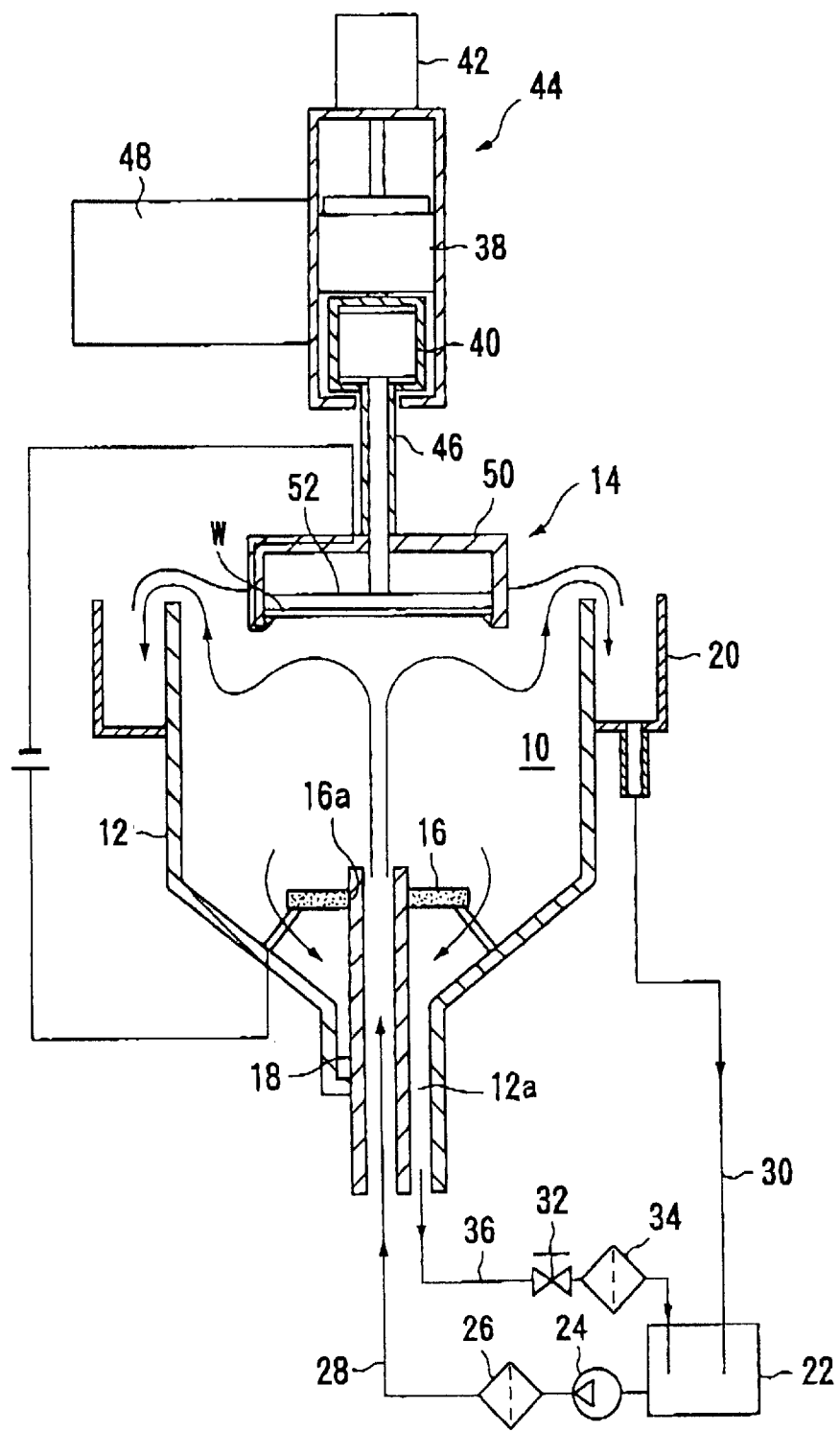
FIG. 1 is a sectional front elevational view of a plating apparatus according to a first embodiment of the present invention.

FIGS. 1 through 7 show a plating apparatus according to a first embodiment of the present invention. As shown in FIG. 1, the plating apparatus has a cylindrical plating chamber 12 which is open upwardly and holds a plating solution 10 therein, and a substrate holder 14 for removably holding a substrate W such as a semiconductor wafer downwardly. The plating chamber 12 houses therein a planar anode plate 16 immersed horizontally in the plating solution 10 and spaced a given distance upwardly from the bottom of the plating chamber 12. The anode plate 16 comprises a disk-shaped soluble plate, which is made of copper with a phosphorus content if the plating apparatus is used to plate the substrate W with copper.

A plating solution ejector pipe 18 for producing an upward jet of plating solution is connected centrally to the bottom of the plating chamber 12. The plating solution ejector pipe 18 extends upwardly in the plating chamber 12 through a central hole 16a defined in the anode plate 16. The plating chamber 12 is surrounded by a plating solution reservoir 20 positioned around an upper portion of the plating chamber 12. The plating solution ejector pipe 18 is connected to a plating solution supply pipe 28 that extends from a plating solution storage tank 22 and has a pump 24 and a filter 26. The plating solution storage tank 22 is connected to a plating solution return pipe 30 extending from the plating solution reservoir 20.

The bottom of the plating chamber 12 has a plating solution outlet 12a defined therein which extends downwardly along the plating solution ejector pipe 18. The plating solution outlet 12a is connected to an end of a plating solution drain pipe 36 which has an on-off valve 32 and a filter 34. The other end of the plating solution drain pipe 36 is connected to the plating solution storage tank 22.

When the pump 24 is actuated, the plating solution 10 is supplied via the plating solution supply pipe 28 and ejected upwardly from the plating solution ejector pipe 18 as an upward jet of plating solution in the plating solution 10 in the plating chamber 12. The plating solution 10 which overflows the plating chamber 12 is retrieved by the plating solution reservoir 20, from which it flows into the plating solution storage tank 22. When the on-off valve 32 is opened, the plating solution 10 on the bottom of the plating chamber 12 flows by gravity into the filter 34, which filters the plating solution 10 before it flows into the plating solution storage tank 22. A pump may be connected to the plating solution drain pipe 36 for forcibly discharging the plating solution 10 on the bottom of the plating chamber 12 into the plating solution storage tank 22.

The substrate holder 14 is connected to the lower end of a rotatable shaft 46 which extends downwardly from an actuator 44. The actuator 44 comprises a motor 38 and a presser plate lifting and lowering mechanism 40 which are housed in a casing, and a substrate holder lifting and lowering mechanism 42 disposed on the upper end of the casing. The actuator 44 is coupled to a free end of a support arm 48 which extends horizontally. When the motor 38 is energized, the substrate W held by the substrate holder 14 is rotated about the axis of the shaft 46 within a horizontal plane The substrate W held by the substrate holder 14 is vertically moved when the substrate holder lifting and lowering mechanism 42 is actuated.

Figure 2:
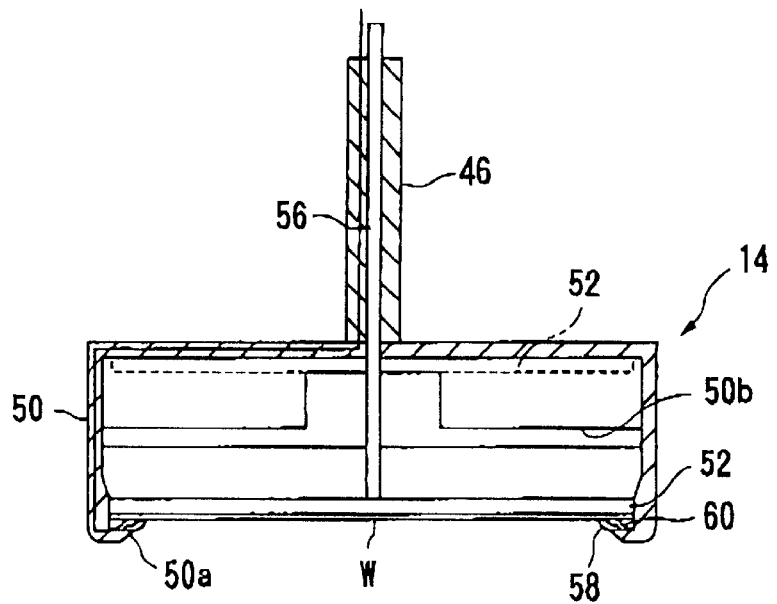
FIG. 2 is a sectional front elevational view of a substrate holder of the plating apparatus shown in FIG. 1.
Figure 3:
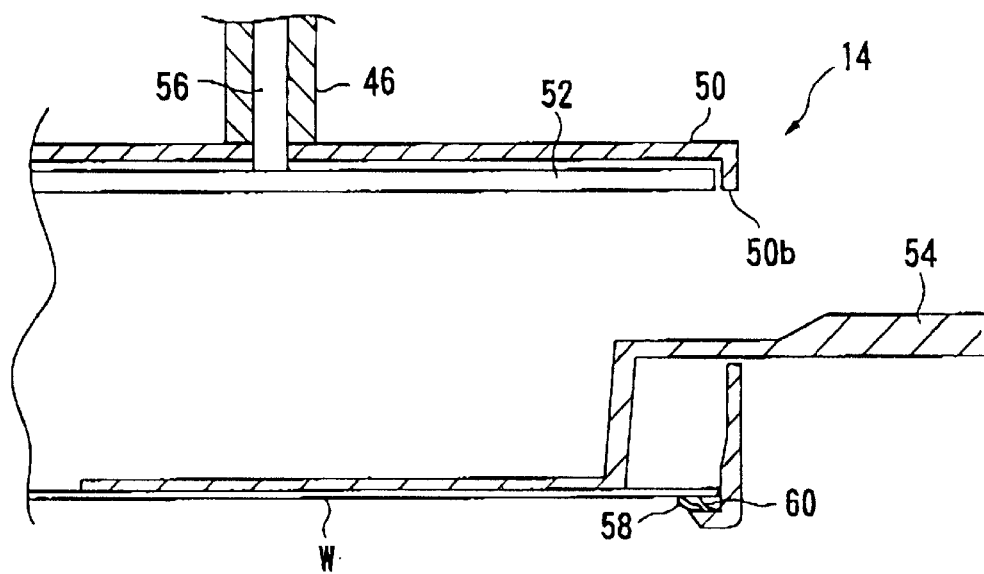
FIG. 3 is an enlarged fragmentary cross-sectional view of the substrate holder shown in FIG. 2.
Figure 4:
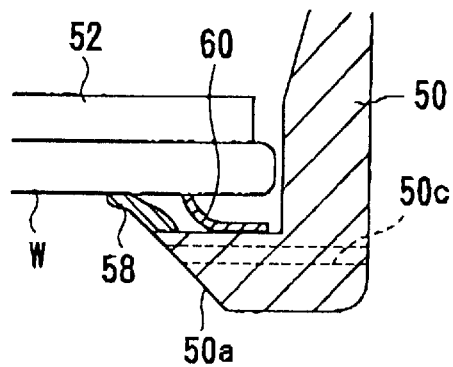
FIG. 4 is an enlarged fragmentary cross-sectional view of the substrate holder shown in FIG. 3.

As shown in FIGS. 2 through 4, the substrate holder 14 mainly comprises a cylindrical substrate holding case 50 having a diameter slightly greater than the diameter of the substrate W that is to be held in the substrate holding case 50, and a disk-shaped substrate presser 52 disposed in the substrate holding case 50 and having a diameter that is substantially the same as the diameter of the substrate W. The substrate holding case 50 is made of an insulating material, and has a lower opening 50a defined in the lower end thereof which has a diameter slightly smaller than the diameter of the substrate W. The substrate holding case 50 has an upper closed end, and has a substrate removal slot 50b defined in a side wall thereof at an upper position which is protected against the entry of the plating solution 10. The substrate W can be inserted into and removed from the substrate holding case 50 via the substrate removal slot 50b by a robot arm 54, for example. The substrate presser 52 is also made of an insulating material, and is connected to the lower end of a substrate presser shaft 56 extending vertically through the rotatable shaft 46. The substrate presser shaft 56 can be moved vertically by the presser plate lifting and lowering mechanism 40.

The presser plate lifting and lowering mechanism 40 comprises a spring for lowering the substrate presser shaft 56 and an air cylinder for lifting the substrate presser shaft 56, The air cylinder is connected to air pipes that are connected to an external pneumatic system by a rotary joint above the motor 38. The substrate removal slot 50b may be covered with a cover for protection against the entry of the plating solution 10.

As shown in FIG. 4, a seal member 58 that projects obliquely upwardly is disposed in the substrate holding case 50 around the lower opening 50a. A plurality of cathode pins 60 that also project obliquely upwardly for supplying an electric power to the substrate W are mounted on the substrate holding case 50. The cathode pins 60 may alternatively be in the form of a single ring-shaped cathode pin. When the substrate W is held by the substrate holder 14, the substrate W and the cathode pins 60 are held in contact with each other. At the same time, the upper end of the seal member 58 is held in intimate contact with the lower surface of the substrate W along its outer peripheral edge for preventing the plating solution 10 from entering the substrate holding case 50 and coming in contact with the cathode pins 60, thus preventing a plated layer from being deposited on the cathode pins 60.

The substrate holding case 50 has vent holes 50c extending horizontally in communication with the lower opening 50a. When the substrate W held by the substrate holder 14 is brought into contact with the plating solution 10 while the substrate W is in rotation, air bubbles trapped between the substrate W and the plating solution 10 are removed through the vent holes 50c.

For making the potential on the lower surface of the substrate W which is to be plated uniform, it is preferable that the cathode pins 60 be closely arranged so as to contact the lower surface of the substrate W substantially fully along the outer peripheral edge thereof, or the ring-shaped cathode pin 60 have an inner circumferential edge bent toward the substrate W so as to be held resiliently in linear contact with the substrate W.

Figure 28A:
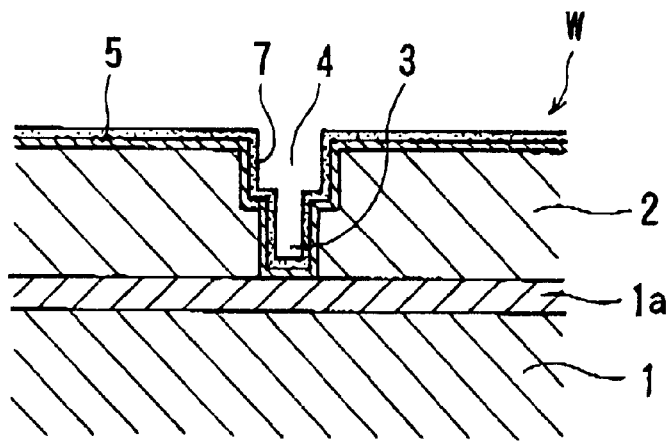
FIG. 28A is a cross-sectional view of a substrate with a copper seed layer formed thereon.

Operation of the plating apparatus thus constructed will be described below for plating the substrate W with copper or copper alloy to form an interconnection circuit on the substrate W. As shown in FIG. 28A, the substrate W to be plated has an oxide film 2 of SiO2 deposited on a conductive layer 1a on a semiconductor substrate 1 on which semiconductor devices are formed. A contact hole 3 and an interconnection groove 4 are formed in the oxide film 2 by lithography and etching, and a barrier layer 5 of TiN or the like and a shield layer 7 are formed on the surface formed so far.

The substrate W is held and carried by the robot arm 54, and introduced through the substrate removal slot 50b into the substrate holding case 50 of the substrate holder 14 which has been lifted by the substrate holder lifting and lowering mechanism 42. The introduced substrate W is placed in contact with the cathode pins 60 and the seal member 58 when the substrate presser 52 is lifted. Thereafter, the substrate presser 52 is lowered to hold the substrate W against the cathode pins 60 and the seal member 58.

Figure 5:
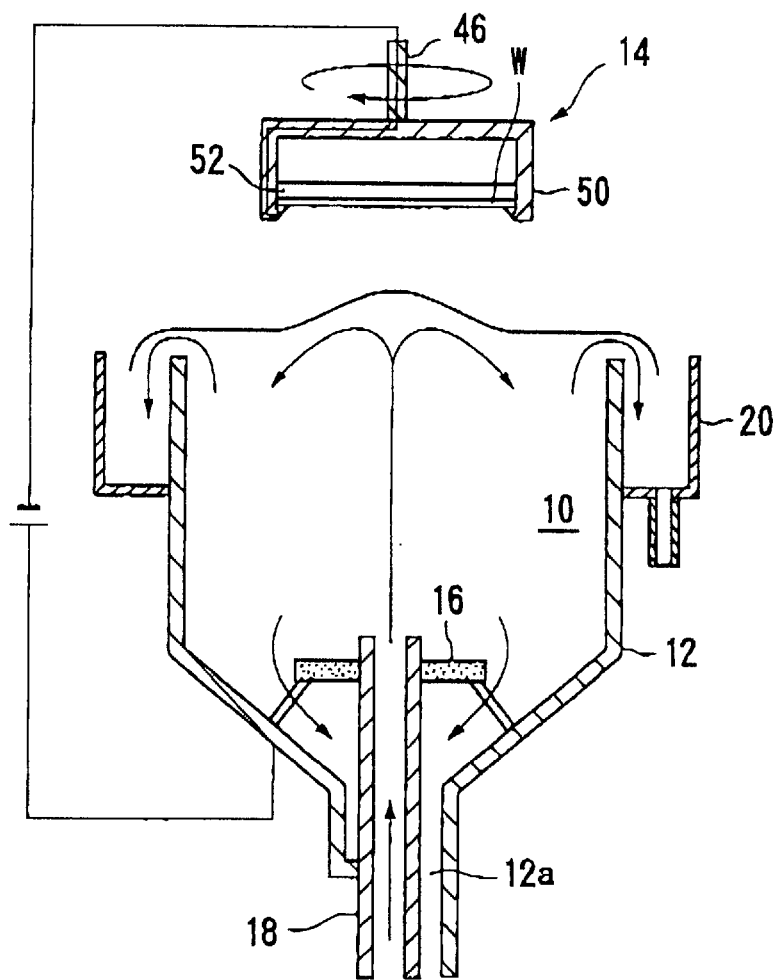
FIG. 5 is a cross-sectional view showing a state immediately prior to a plating process carried out by the plating apparatus shown in FIG. 1.

Then, as shown in FIG. 5, the pump 24 is actuated to eject the plating solution 10 via the plating solution supply pipe 28 upwardly from the plating solution ejector pipe 18 as an upward jet of plating solution in the plating solution 10 in the plating chamber 12, forming an upward bulge on the surface of the plating solution 10. The plating solution 10 which overflows the plating chamber 12 is retrieved by the plating solution reservoir 20, from which it flows into the plating solution storage tank 22. If necessary, the on-off valve 32 is opened to drain the plating solution 10 from the bottom of the plating chamber 12. A predetermined voltage is applied between the anode plate 16 and the substrate W. The motor 38 is energized to rotate the substrate W at a speed in the range from 50 to 300 rotations per minute, and the substrate holder lifting and lowering mechanism 42 is operated to lower the substrate holder 14.

As shown in FIG. 6, the lower surface of the substrate W contacts the crest of the upward bulge on the surface of the plating solution 10. As the substrate W is further lowered, the lower surface of the substrate W contacts the plating solution 10 in an area that progressively spreads outwardly. At the same time, air bubbles formed underneath the lower surface of the substrate W are expelled outwardly under centrifugal forces produced by the rotation of the substrate W.

After the lower surface of the substrate W contacts the plating solution 10, the substrate W is lowered at a relatively low rate of 30 mm/second to provide a sufficient period of time required to expel air bubbles outwardly from underneath the lower surface of the substrate W. The outwardly expelled air bubbles are discharged efficiently through the vent holes 50c. Until the substrate W is fully immersed in the plating solution 10, a small voltage for preventing the surface of the substrate W from being eroded by the plating solution may be applied between the anode plate 16 and the substrate W. After the substrate W is fully immersed in the plating solution 10, a predetermined voltage for plating the substrate W may be applied between the anode plate 16 and the substrate W.

Figure 7:
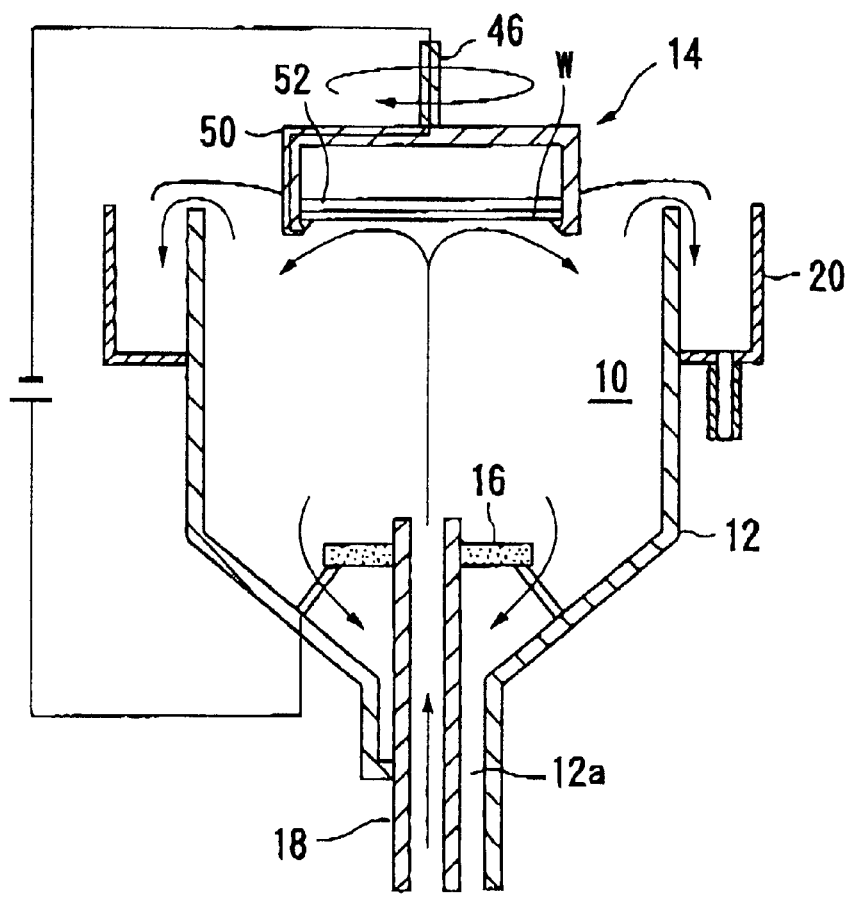
FIG. 7 is a cross-sectional view showing the plating process carried out by the plating apparatus shown in FIG. 1.

As shown in FIG. 7, the substrate W is further lowered until it is fully immersed in the plating solution 10, and the lower surface of the substrate W is plated. According to the conventional jet plating process which employs an upward jet of plating solution, the substrate is positioned above the upper end of the plating chamber while the surface of the substrate to be plated is facing downwardly and contacting the upward bulge on the surface of the plating solution. According to the present embodiment of the invention, the seal member 58 of the substrate holder 14 keeps those surfaces of the substrate W, other than the surface to be plated, out of contact with the plating solution 10. Therefore, the substrate holder 14 and the substrate W held by the substrate holder 14 can be immersed in the plating solution 10 while the substrate W is being plated. Consequently, the distance between the surface to be plated of the substrate W and the anode plate 16 can be freely adjusted. In addition, the substrate W which is being held by the substrate holder 12 can be moved out of the plating chamber 12, and both the substrate W and the substrate holder 12 can be washed with water.

The plating solution flow in the plating chamber 12 and the electric field between the anode plate 16 and the surface to be plated of the substrate W are not necessarily uniform in the circumferential direction. However, when the substrate W is rotated in the plating chamber 12, the uniformity of the plated film on the substrate W can be increased. The substrate W may be rotated at a low speed in the range from 10 to 300 rotations per minute.

The anode plate 16 comprises a disk-shaped soluble plate, which is made of copper with a phosphorus content if the plating apparatus is used to plate the substrate W with copper. When the substrate W is plated with copper, a black film is formed on the surface of the anode plate 16, and then peeled off the surface of the anode plate 16 as small fragments that enter the plating solution 10. The peeled-off fragments of the black film are discharged together with the plating solution 10 near the anode plate 16 out of the plating chamber 12 via the plating solution outlet 12a. Therefore, the peeled-off fragments are prevented from being attached to the surface of the plated film on the substrate W, and hence from lowering the quality of the plated film on the substrate W. Other foreign matter attached and deposited on the anode plate 16 is also removed and discharged via the plating solution outlet 12a, and hence prevented from being carried on the jet of plating solution and attached to the surface of the plated film on the substrate W.

The anode plate 16, which is made of copper with a phosphorus content for use in copper sulfate electroplating, is prevented by the black film from being passivated and disproportionated, and plays an important role to produce an adequate plated film on the substrate W. However, because the black film tends to be peeled off the anode plate 16 as fragments or particles, which are liable to cause the plated film to be precipitated abnormally, attention should be paid to the positional relationship between the anode plate 16 and the substrate W and the flow of the plating solution therebetween. Particularly, it is important that the surface of the substrate W to be plated not be positioned downstream of the plating solution that has flowed on the surface of the anode plate 16.

The black film is heavier than the plating solution, and most of the fragments of the black film that have been peeled off fall onto the bottom of the plating chamber 12. Since other foreign matter attached and deposited on the anode plate 16 is mostly heavier than the plating solution 10, the plating solution outlet 12a should preferably be positioned below the anode plate 16 in the vicinity thereof. If the bottom of the plating chamber 12 is of a conical shape, then the plating solution outlet 12a should preferably be positioned at the lowest area of the conical bottom of the plating chamber 12. When the plating solution which will be discharged via the plating solution outlet 12a flows smoothly along the surface of the anode plate 16, fragments of the black film and other matter deposited on the surface of the anode plate 16 can efficiently flow together with the plating solution 10 out of the plating solution outlet 12a.

Applying a strong flow of the plating solution 10 to the surface of the anode plate 16 should be avoided because it would accelerate the peeling of the black film off the anode plate 16 and make the black film unstable on the anode plate 16.

When the substrate W is rotated, the relative speed between the surface of the substrate W to be plated and the plating solution 10 is increased, and the concentration diffusion layer near the surface of the substrate W to be plated is thinned, thus preventing the supply line from being plated.

As a result, a uniform plated film can be formed on the entire surface to be plated of the substrate W. Furthermore, a current density can be increased to allow the substrate W to be plated at a high speed.

Figure 28B:
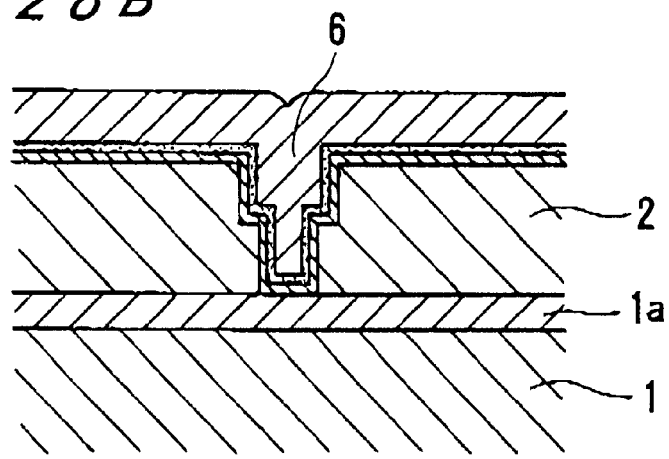
FIG. 28B is a cross-sectional view of the substrate whose surface is plated.
Figure 28C:
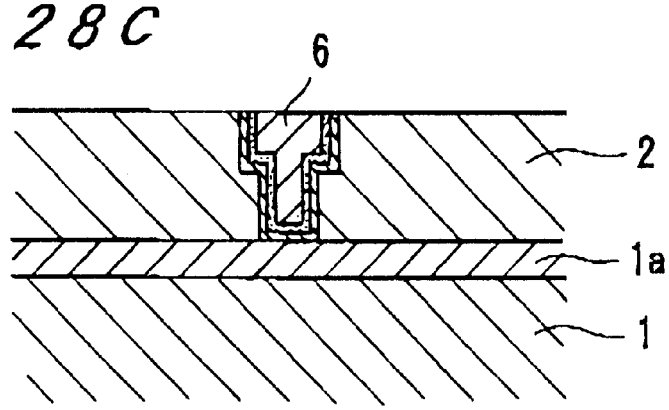
FIG. 28C is a cross-sectional view of the substrate which is polished by a CMP process to form an interconnection in the form of a copper layer.

According to the above plating process, copper is filled in the contact hole 3 and the groove 4 in the semiconductor substrate W, as shown in FIG. 28B. Thereafter, a chemical mechanical polishing (CMP) process is carried out to remove the copper layer deposited on the oxide film 2, making the copper layer 6 in the contact hole 3 and the groove 4 lie flush with the oxide film 2. In this manner, an interconnection made of the copper layer 6 is produced as shown in FIG. 28C.

After the above plating process is finished, the substrate holder lifting and lowering mechanism 42 lifts the substrate holder 14 to a position where the substrate W is kept out of contact with the plating solution 10. Then, the substrate W is rotated at a speed of 500 rotations per minute, preferably 1000 rotations per minute or higher, to spin off the plating solution. Thereafter, the substrate presser 52 is elevated, and the robot arm 54 is inserted into the substrate holding case 50. The robot arm 54 holds the substrate W, removes the substrate W out of the substrate holding case 50, and delivers the substrate W to the next process.

Figure 8:
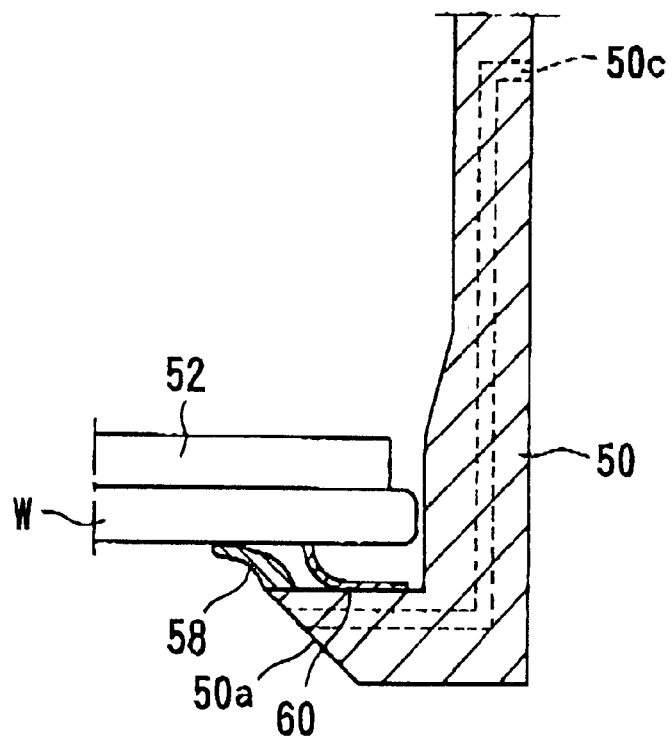
FIG. 8 is an enlarged fragmentary cross-sectional view showing a vent hole according to another arrangement for use in the substrate holder of the plating apparatus shown in FIG. 1.

FIG. 8 shows a vent hole 50c according to another arrangement for removing air bubbles from beneath the lower surface of the substrate W to be plated and out of the substrate holding case 50. In FIG. 8, the vent hole 50c has an end open at the lower opening 50a in the substrate holding case 50 below the lower surface of the substrate W, and extends in a hook shape upwardly in the side wall of the substrate holding case 50. The vent hole 50c has an opposite end open at the outer circumferential surface of the substrate holding case 50. The open end of the vent hole 50c at the outer circumferential surface of the substrate holding case 50 is positioned above the surface of the plating solution 10 in the plating chamber 12. With the open end of the vent hole 50c positioned above the surface of the plating solution 10, air bubbles can easily be removed from beneath the lower surface of the substrate W and out of the substrate holding case 50. The vent hole 50c may be open at an upper or inner surface of the substrate holding case 50 insofar as the open end of the vent hole 50c is positioned above the surface of the plating solution 10.

Figure 9:
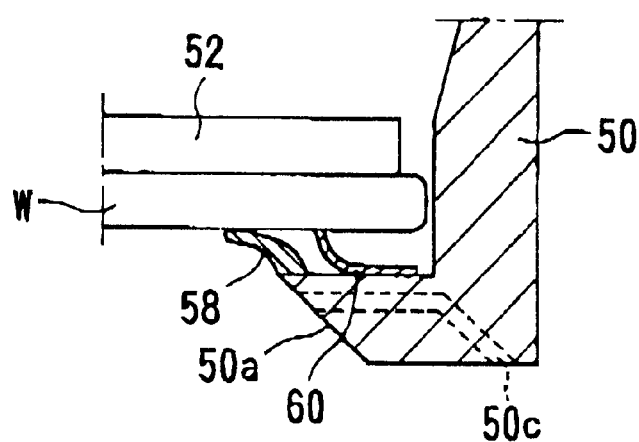
FIG. 9 is an enlarged fragmentary cross-sectional view showing a vent hole according to still another arrangement for use in a substrate holder of the plating apparatus shown in FIG. 1.
Figure 10:
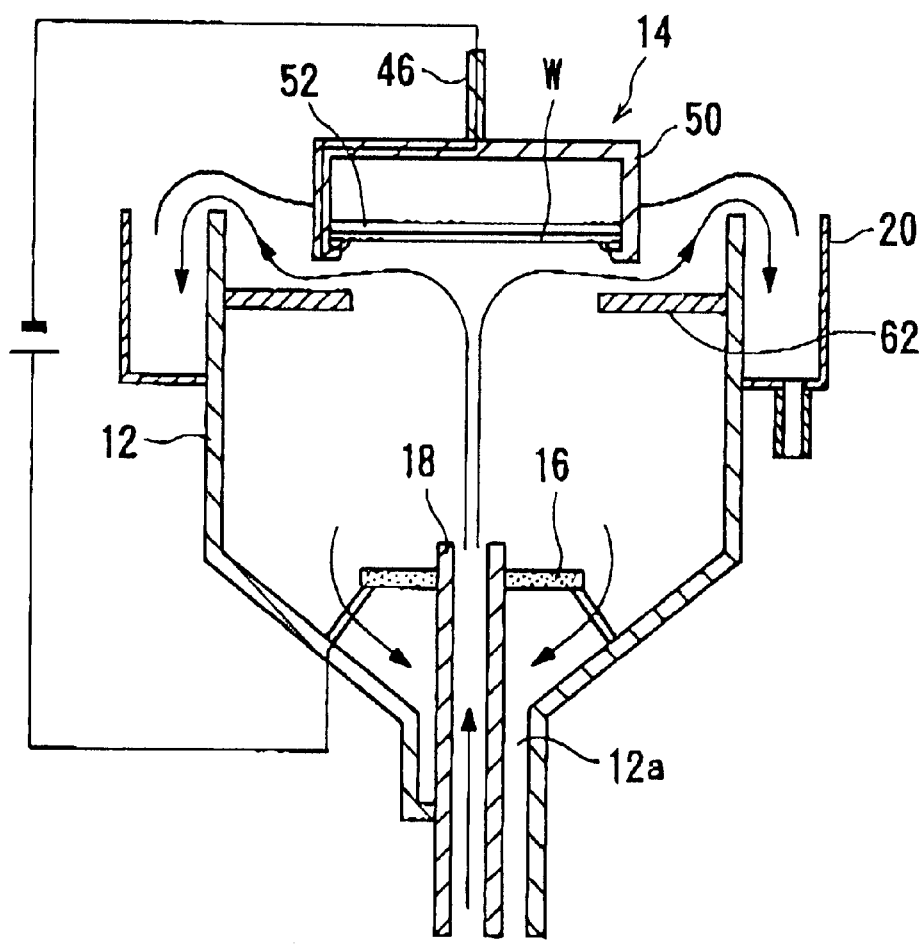
FIG. 10 is a sectional front elevational view of a plating apparatus according to a second embodiment of the present invention.

FIG. 9 shows a vent hole 50c according to still another arrangement for removing air bubbles from beneath the lower surface of the substrate W to be plated and out of the substrate holding case 50. In FIG. 9, the vent hole 50c has an end open at the lower opening 50a in the substrate holding case 50 below the lower surface of the substrate W, and an opposite end open at a lower surface of the substrate holding case 50 near its outer circumferential edge. The vent hole 50c shown in FIG. 9 is particularly useful when incorporated in the substrate holder of a plating apparatus according to a second embodiment of the present invention shown in FIG. 10. In the plating apparatus shown in FIG. 10, the plating chamber 12 has a horizontal partition 62 directly below the outer circumferential edge of the substrate holder 14, the partition 62 being greater than the surface of the substrate W of the plated. Since the plating solution 10 flows at an increased speed below the outer circumferential edge of the substrate holder 14 due to the partition 62, the static pressure below the outer circumferential edge of the substrate holder 14 drops. Air bubbles trapped by the lower surface of the substrate W can be discharged via the vent hole 50c because of the static pressure drop below the outer circumferential edge of the substrate holder 14.

In the above embodiments, the substrate W is held horizontally, and the lower surface thereof is plated. However, the substrate W may be held obliquely at any desired angle between vertical and horizontal planes that is defined to keep the substrate in the plating solution and to prevent the plating solution from entering into the substrate holding case. Thus, the substrate W may be inclined to the surface of the plating solution 10 at any desired angle between vertical and horizontal planes that is defined to keep the substrate in the plating solution and that prevents the plating solution from entering into the substrate holding case. This modification may be applied to any of the embodiments described below.

FIG. 11 shows a plating apparatus according to a third embodiment of the present invention. As shown in FIG. 11, the plating apparatus has a plating solution ejector pipe 18 extending horizontally through the side wall of the plating chamber 12 and having a distal end bent upwardly at a right angle. The plating apparatus also has a plating solution drain pipe 70 extending vertically through the bottom of the plating chamber 12. The plating solution drain pipe 70 has an increased-diameter portion on its upper end, and an anode plate 16 having a plurality of through holes 16b defined therein is disposed in an upper end of the increased-diameter portion. Other details of the plating apparatus according to the third embodiment are identical to those of the plating apparatus according to the first embodiment.

According to the third embodiment, black film fragments peeled off the surface of the anode plate 16 are effectively discharged together with the plating solution out of the plating chamber 12, for protection against being attached to the surface of the substrate W to be plated. The plating solution ejector pipe 18 arranged as shown in FIG. 11 is effective to produce an upward bulge on the surface of the plating solution 10.

FIG. 12 shows a plating apparatus according to a fourth embodiment of the present invention. As shown in FIG. 12, the plating apparatus has a plating chamber 12 having a funnel-shaped circumferential wall spreading outwardly in the upward direction. A plurality of (four in the illustrated embodiment) plating solution ejector pipes 18 are connected to the funnel-shaped circumferential wall of the plating chamber 12 at circumferentially equal intervals. The plating solution ejector pipes 18 are oriented to direct respective jets of plating solution substantially to the center of the surface of the plating solution 10 in the plating chamber 12. A flat anode plate 16 having a number of through holes 16b defined therein is mounted on a bottom portion of the funnel-shaped circumferential wall of the plating chamber 12. According to the fourth embodiment, black film fragments peeled off the surface of the anode plate 16 are prevented from being carried and attached to the surface to be plated of the substrate W.

In the fourth embodiment, the plating solution ejector pipes 18 are connected to respective flow regulating valves for substantially equalizing the rates at which the plating solution 10 is ejected from the respective plating solution ejector pipes 18.

FIG. 13 shows a plating apparatus according to a fifth embodiment of the present invention. As shown in FIG. 13, the plating apparatus according to the fifth embodiment differs from the plating apparatus according to the fourth embodiment shown in FIG. 12 in that a partly spherical anode plate 16 having a number of through holes 16b defined therein is used instead of the flat anode plate 16 shown in FIG. 12. If the anode plate 16 is smaller in size than the substrate W and the distance between the substrate W and the anode plate 16 is small, the partly spherical anode plate 16 is effective to make the electric current distribution between the substrate W and the anode plate 16 uniform.

Specifically, if the anode plate 16 is substantially the same size as the substrate W, then the anode plate 16 should be a flat shape racing the substrate W, as shown in FIG. 12. If the anode plate 16 is smaller in size than the substrate W and the distance between the substrate W and the anode plate 16 is small, then the partly spherical anode plate 16 should preferably be used, as shown in FIG. 13.

In each of the embodiments shown in FIGS. 12 and 13, a plurality of (four in the illustrated embodiment) plating solution ejector pipes 18 are disposed at the same height in circumferentially equally spaced intervals in the vicinity of the outer circumference of the bottom (or side wall) of the plating chamber 12 at positions spaced from the central axis thereof Therefore, the ejected jet of plating solution will not be brought into direct contact with the anode plate 16. The jets of plating solution ejected from the respective plating solution ejector pipes 18 are oriented such that the upper end of the plating chamber 12 and the directions of the jets intersect with each other at positions spaced from the center of the plating chamber 12 toward the plating solution ejector pipes 18. The jets are oriented in directions that are slightly displaced laterally off the central axis of the plating chamber 12 and that pass through positions spaced from the central axis of the plating chamber 12 by respective distances smaller than ½ of the radius of the substrate W. The central axis of the substrate W and the central axis of the plating chamber 12 are aligned with each other. The directions of all the plating solution ejector pipes 18 disposed in the plating chamber 12 are adjusted such that the points of intersection between the plane from which the plating solution overflows and the directions of the jets are spaced from the central axis of the plating chamber 12 by substantially the same distance, and the directions of the jets are angularly displaced substantially the same angle to the same side from the central axis of the plating chamber 12.

The use of the plural plating solution ejector pipes 18 allows the anode plate 16 to be positioned centrally in the plating chamber 12, and also allows the jets from the plural plating solution ejector pipes 18 to produce an upward bulge on the surface of the plating solution 10. As described above, when the substrate W is lowered, the lower surface of the substrate W contacts the plating solution 10 in an area that progressively spreads outwardly, making it easy to remove air bubbles from the lower surface of the substrate W.

Since the directions of the jets of plating solution ejected from the plating solution ejector pipes 18 are selected as described above, slow swirls are generated in the substantially cylindrical plating chamber 12, stabilizing the flow of the plating solution therein. The slow swirls cause the plating solution to flow in the outer circumferential region of the plating chamber 12, where the plating solution would be slowed down if only the jets were ejected. Therefore, the plating solution speed distribution can be improved over the overall surface of the substrate W to be plated. If the plating solution in the plating chamber 12 were to be only rotated, then it would be effective to direct the jets of plating solution horizontally along the outer circumference of the plating chamber 12. However, the surface of the plating solution would be lowered at the center and raised at the outer circumferential region, making it difficult to remove air bubbles from the lower surface of the substrate W. In order to rotate the plating solution 10 while forming an upward bulge on the surface of the plating solution 10, the directions of the jets should pass through positions spaced from the central axis of the plating chamber 12 by respective distances smaller than ½ of the radius of the substrate W, as described above.

Figure 14:
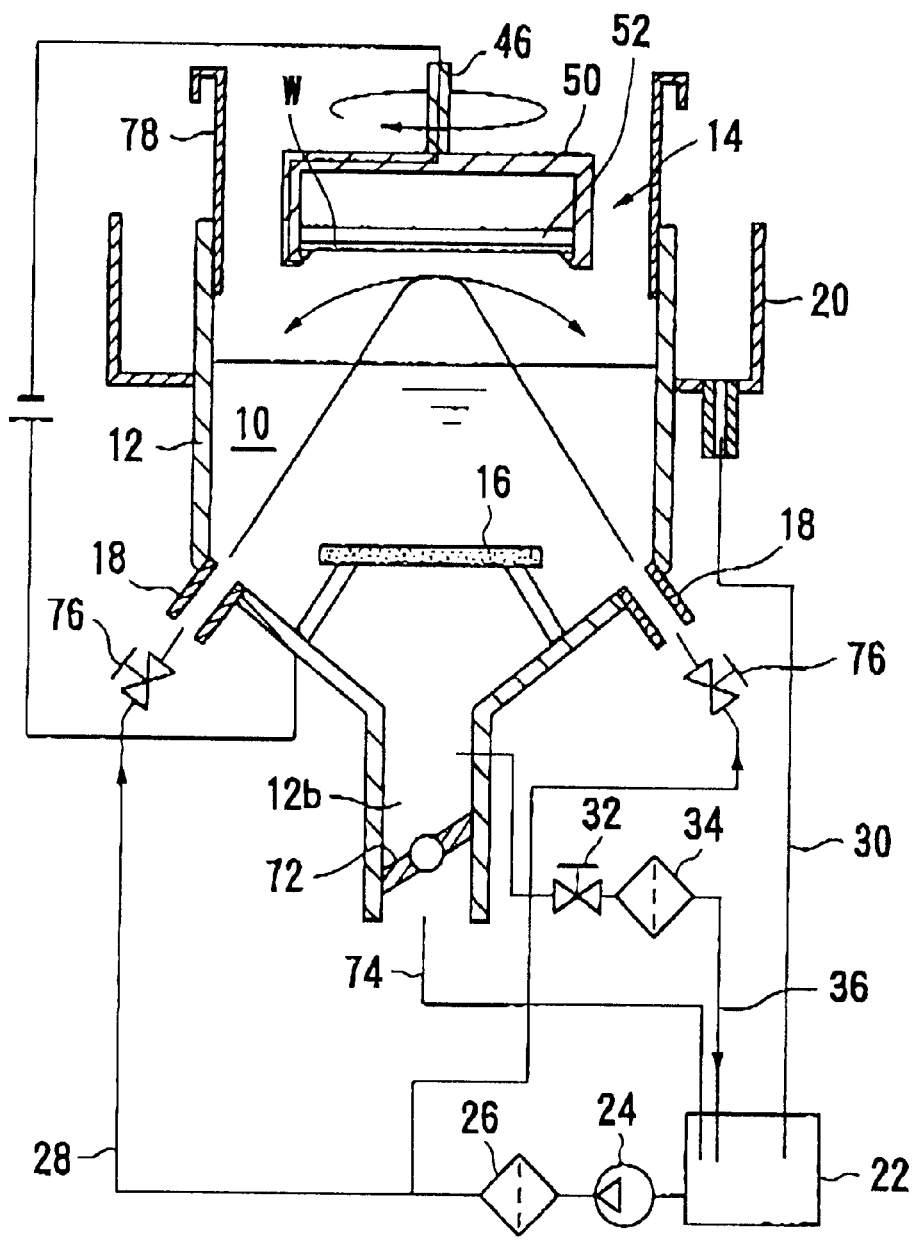
FIG. 14 is a sectional front elevational view of a plating apparatus according to a sixth embodiment of the present invention.

FIG. 14 shows a plating apparatus according to a sixth embodiment of the present invention. According to the sixth embodiment, the bottom of the plating chamber 12 has a plating solution outlet 12b defined therein which has a shutoff valve 72 disposed therein. The plating solution outlet 12b is connected to the plating solution storage tank 22 by a plating solution drain pipe 74. The plural plating solution ejector pipes 18 are connected to respective plating solution supply pipes 28 which have respective adjusting and/or on-off valves 76 disposed near the plating solution ejector pipes 18. The plating solution ejector pipes 18 are spaced at substantially equal intervals such that the jets ejected therefrom are oriented substantially toward the center of the surface of the plating solution 10. A cover 78 for preventing the plating solution from being scattered around is vertically movably mounted on an upper portion of the plating chamber 12.

The use of the plural plating solution ejector pipes 18 allows the anode plate 16 to be positioned centrally in the plating chamber 12, and also allows the jets from the plural plating solution ejector pipes 18 to produce an upward bulge on the surface of the plating solution 10. As described above, when the substrate W is lowered, the lower surface of the substrate W is contacted with the plating solution 10 in an area that progressively spreads outwardly, making it easy to remove air bubbles from the lower surface of the substrate W.

Since the directions of the jets of plating solution ejected from the plating solution ejector pipes 18 are selected as described above, slow swirls are generated in the substantially cylindrical plating chamber 12, stabilizing the flow of the plating solution therein. The slow swirls cause the plating solution to flow at a speed in the outer circumferential region of the plating chamber 12, where the plating solution would be slowed down if only the jets were ejected, so that the plating solution speed distribution can be improved over the overall surface to be plated of the substrate W. If the plating solution in the plating chamber 12 were to be only rotated, then it would be effective to direct the jets of plating solution horizontally along the outer circumference of the plating chamber 12. However, the surface of the plating solution would be lowered at the center and raised at the outer circumferential region, making it difficult to remove air bubbles from the lower surface of the substrate W. In order to rotate the plating solution 10 while forming an upward bulge on the surface of the plating solution 10, the directions of the jets should pass through positions spaced from the central axis of the plating chamber 12 by respective distances smaller than ½ of the radius of the substrate W, as described above.

FIG. 14 shows a plating apparatus according to a sixth embodiment of the present invention. According to the six embodiment, the bottom of the plating chamber 12 has a plating solution outlet 12b defined therein which has a shutoff valve 72 disposed therein. The plating solution outlet 12b is connected to the plating solution storage tank 22 by a plating solution drain pipe 74. The plural plating solution ejector pipes 18 are connected to respective plating solution supply pipes 28 which have respective adjusting and/or on-off valves 76 disposed near the plating solution ejector pipes 18. The plating solution ejector pipes 18 are spaced at substantially equal intervals such that the jets ejected therefrom are oriented substantially toward the center of the surface of the plating solution 10. A cover 78 for preventing the plating solution from being scattered around is vertically movably mounted on an upper portion of the plating chamber 12.

In the sixth embodiment, when the pump 24 is operated while the adjusting and/or on-off valves 76 are open, the plating solution is ejected from the plating solution ejector pipes 18 toward the surface of the plating solution in the center of the plating chamber 12, impinges on the substrate W that is disposed slightly below the upper edge of the plating chamber 12 with its surface to be plated facing down, and circulates in the plating chamber 12. The plating solution in the plating chamber 12 overflows the upper edge of the plating chamber 12, is retrieved by the plating solution reservoir 20 positioned around the plating chamber 12, and returns to the plating solution storage tank 22.

For starting the plating process, some of the plating solution in the plating chamber 12 is discharged from the plating chamber 12 within the range of the anode plate 16 not being exposed. Then, the substrate W is held by the substrate holder 14 and placed in a position slightly below the upper edge of the plating chamber 12, after which the substrate holder 14 is rotated. Then, the plating solution is ejected into the plating chamber 12. The surface of the plating solution in the plating chamber 12 is raised, and the lower surface of the substrate W to be plated is brought into contact with the crest of the upward bulge which is formed on the surface of the plating solution 10 by the jets of plating solution. The area of contact between the substrate W and the upward bulge on the surface of the plating solution 10 spreads progressively outwardly. At the same time, air bubbles underneath the surface to be plated of the substrate W are expelled outwardly under centrifugal forces produced upon rotation of the substrate W.

As the amount of the plating solution 10 in the plating chamber 12 increases, the strength of the jets of plating solution decreases. The entire surface to be plated of the substrate W has been in contact with the upward bulge on the surface of the plating solution 10. As the amount of the plating solution 10 in the plating chamber 12 further increases, the entire surface of the substrate W to be plated is immersed in the plating solution 10 while being covered with the jets of plating solution. Therefore, no air bubbles remain trapped below the surface of the substrate W to be plated, which can be plated in its entirety under good conditions. While the substrate W is being plated, the valve 72 in the plating solution outlet 12b may be slightly opened to allow fragments of the black film on the anode plate 16 as well as the plating solution near the anode plate 16 to flow out of the plating chamber 12.

After the plating process is finished, the valve 72 in the plating solution outlet 12b is opened to transfer some of the plating solution 10 from the plating chamber 12 to the plating solution storage tank 22. The surface of the plating solution 10 in the plating chamber 12 is lowered, exposing the substrate holder 14 and the substrate W held by the substrate holder 14 above the plating solution 10. Then, the substrate presser 52 and the substrate W held by the substrate holder 14 are rotated, spinning off the plating solution 10 from the substrate W under centrifugal forces. Thereafter, the substrate presser 52 is lifted to remove the plated substrate W out of the substrate holding case 50.

FIG. 15 shows a plating apparatus according to a seventh embodiment of the present invention. According to the seventh embodiment, the plating apparatus has a substantially cylindrical plating chamber 12 including a tapered portion disposed around its bottom and having a lower central region that is substantially flat. The plating chamber 12 has a plurality of plating solution outlets 12a disposed below the outer circumferential edge of an anode plate 16 that is positioned centrally in a lower portion of the plating chamber 12, for discharging the plating solution out of the plating chamber 12.

A plating solution supply cavity 80 is disposed on an inner circumferential surface of the plating chamber 12 and divided by a porous plate 82. The plating solution supply pipe 28 is connected to a chamber of the plating solution supply cavity 80 below the porous plate 82. A chamber of the plating solution supply cavity 80 above the porous plate 82 has a second porous plate 84 facing radially inwardly of the plating chamber 12 and extending circumferentially at the same height. The plating solution introduced from the plating solution supply pipe 28 into the plating solution supply cavity 80 passes through the porous plates 82, 84 and flows substantially horizontally into the plating chamber 12 toward the central axis of the plating chamber 12.

A partition plate 86 is disposed in the plating chamber 12 at a position above the second porous plate 84. The partition plate 86 has a hole 88 defined centrally therein which has a diameter smaller than the diameter of the substrate W. The space below the partition plate 86 is open only through the hole 88 defined in the partition plate 86 and plating solution outlets 12a defined in the bottom of the plating chamber 12. Therefore, most of the plating solution supplied from the plating solution supply pipe 28 flows through the hole 88 toward the substrate W. The plating solution that flows upwardly through the hole 88 supplies a fresh plating solution to the surface to be plated of the substrate W, and overflows the upper edge of the plating chamber 12. The overflowing plating solution is retrieved by the plating solution reservoir 20 the same as each of the embodiments above.

Part of the plating solution flows downwardly toward the anode plate 16, and is drained, together with fragments of the black film on the anode plate 16 and other matter attached and deposited on the anode plate 16, via the plating solution outlets 12a.

The plating solution jet flowing from the center to the outer circumference of the surface of the substrate W to be plated tends to cause irregularities in the speed thereof in the radial direction. Swirls of the plating solution around the center of the plating chamber 12 and rotation of the substrate W are effective to reduce such speed irregularities, but it is still difficult to fully eliminate such speed irregularities. The relative speed between the surface of the substrate W to be plated and the plating solution flow may made uniform over the entire surface to be plated of the substrate W by employing parallel flows along the surface of the substrate W to be plated. However, many difficulties arise in realizing such parallel flows because of steps and gradients that are present around the opening in the substrate holder 14 for holding the surface of the substrate W to be plated.

It is possible to improve a relative speed distribution between the overall surface of the substrate W to be plated and the plating solution by imparting a translating and rotating motion to the substrate W. Such a translating and rotating motion, which is also referred to as a scrolling motion, causes the substrate W to make small circular motions without changing the orientation of the substrate W, and allows every point on the substrate W to have the same relative speed with respect to the surrounding area. In order to reduce the effect of flow irregularities and electric field irregularities in the plating chamber 12, it is preferable to rotate the substrate holder 14 slowly about its axis.

FIG. 16 shows a mechanism for translating and rotating the substrate W. As shown in FIG. 16, the mechanism has an actuator 100 with a substrate holder 110 disposed therebelow. The substrate holder 110 is mounted on a rotary plate 113 that is fixed to the lower end of a rotatable shaft 111 which is rotatable about an axis L1. The substrate holder 110 is rotatably supported on the rotary plate 113 by a plurality of crankshafts 115. A scroll shaft 117 extends axially through the rotatable shaft 111 for rotation about a scroll axis L2 that is spaced from the axis L1 by a scroll radius e. The scroll shaft 117 has a lower portion shaped into a cylindrical member which has a central axis spaced the scroll radius e from the remainder of the scroll shaft 117, and which has a radius greater than the radius of the remainder of the scroll shaft 117. The cylindrical member is rotatably mounted on an upper surface of the substrate holder 110.

The relative positional relationship between each of the central axes of the crankshafts 115 and the central axis of the scroll shaft 117 remains the same on the rotary plate 113 and the upper surface of a substrate holding case 119. When the scroll shaft 117 is rotated about its axis while the shaft 111 is being locked against rotation, the substrate holding case 119 makes a translating and rotating motion, i.e., a scrolling motion, about the scroll axis L2.

When the shaft 111 is rotated, the position of the scroll shaft 117 is displaced. Therefore, a scrolling motor 121 for rotating the scroll shaft 117 is disposed in the actuator 110 and fixed to the upper end of the shaft 111. A substrate presser plate 123 in the substrate holding case 119 is moved vertically by a substrate presser shaft 125 that extends axially through the scroll shaft 117 at the scroll axis L2. The substrate presser shaft 125 has a lower portion bent into a crank shape by a distance equal to the scroll radius e in the substrate holding case 119. The substrate presser shaft 125 has a lower end rotatably connected to the center of the substrate presser plate 123 for transmitting axial forces thereto. The substrate presser shaft 125 has an upper portion extending out of the scroll shaft 117 and connected to a presser plate lifting and lowering mechanism 127 such as an air cylinder or the like which is aligned with the axis L1, by two joints and a crankshaft that are capable of transmitting axial forces and bending moments and are also rotatable. Therefore, while the substrate holding case 119 is making a scrolling motion, the presser plate lifting and lowering mechanism 127 can transmit pressing forces to the substrate presser plate 123. The shaft 111 can be rotated by a motor 129 disposed in the actuator 100.

In order to bring the center of gravity of the rotating mass into alignment with the axis about which it rotates when spinning off the plating solution from the substrate W after the substrate W has been plated, the position at which the scroll shaft 117 is to be stopped is controlled so as to align the central axis of the substrate holding case 119 with the axis about which it rotates when the scrolling motion comes to an end. Such stop position control may be achieved by monitoring the angular displacement of a drive gear of the scroll shaft 117 with an optical sensor or a magnetic sensor and controlling the position where the scrolling motor 121 is to be de-energized based on a monitoring signal from the optical sensor or the magnetic sensor.

The substrate holder 110 is moved vertically when a movable frame 133, which holds the various drive mechanisms and bearings in the actuator 100, is vertically moved by a vertical drive mechanism 131. Although the vertical distance that the substrate holder 110 moves is shown as being small in FIG. 16, the substrate holder 110 actually needs to be moved vertically a distance of about 100 mm because a cover for preventing the plating solution from being scattered around at the time of spinning off the plating solution from the substrate W is mounted on an upper portion of the plating chamber. The substrate holder 110 is required to be stopped in three positions, including a position to immerse the substrate W in the plating solution, a position to spin off the plating solution from the substrate W above the surface of the plating solution, and a position to remove the substrate W. The substrate holder 110 is also required to rotate and lower the substrate W slowly into contact with the plating solution prior to the plating process. Consequently, the vertical drive mechanism 131 is controllable to move and stop the substrate holder 110 in those positions and to cause the substrate holder 110 to rotate and lower the substrate W in the above fashion.

The mechanism for holding the substrate W with the substrate holding case 119, the substrate presser plate 123, the sealing member, and the cathode pins is essentially the same as the mechanism shown in FIG. 2. The substrate holding case 119 has a substrate removal slot 135 defined in a side wall thereof The cathode pins and an electric power supply are connected by wires that extend through the wall of the substrate holding case 119 and are connected by a slidable slip ring to the substrate presser shaft 125, which is connected to a similar slidable slip ring on the presser plate lifting and lowering mechanism 127 that is connected to the negative electrode of the electric power supply.

FIG. 17 illustrates a plating process carried out by a plating facility according to an embodiment of the present invention. As shown in FIG. 17, the plating process carried out by the plating facility includes a copper plating step ST1 for plating a substrate, which comprises a semiconductor wafer or the like having minute grooves and holes for interconnections, with copper according to copper sulfate electroplating, a chemical cleaning and outer circumferential etching step ST2 for cleaning the plated substrate with a chemical solution and etching away a thin copper film on an outer circumferential area of the substrate with a chemical solution, a pure water cleaning step ST3 for cleaning the cleaned and etched substrate with pure water, a drying step ST4 for drying the substrate which has been cleaned with pure water, and an annealing step ST5 for heating the dried substrate to anneal same.

FIG. 18 shows a layout of various processing units of the plating facility. As shown in FIG. 18, the plating facility, generally denoted by 200, has a loading unit 201, an unloading unit 202, annealing units 203, 204, pure water cleaning and drying units 205, 206, chemical cleaning and outer circumferential etching units 207, 208, temporary storage units 209, 210, copper plating units 211 through 214, and feed mechanisms 215, 216.

The plating facility 200 operates as follows: First, a cassette carrying a plurality of substrates to be plated with copper is introduced into the loading unit 201. The feed mechanism 215, which may comprise a robot or the like, removes one of the substrates at a time from the cassette in the loading unit 201, delivers and places the substrate in the temporary storage unit 209. The feed mechanism 216, which may comprise a robot or the like, removes the substrate from the temporary storage unit 209, brings the substrate into one of the copper plating units 211 through 214 where the substrate is electroplated with copper for a predetermined period of time.

The substrate that has been plated with copper is removed by the feed mechanism 216, which delivers and places the plated substrate in the temporary storage unit 210. The feed mechanism 215 then carries the plated substrate into one of the chemical cleaning and outer circumferential etching units 207, 208 where the plated substrate is cleaned with a chemical solution and the thin copper film on the outer circumferential area of the substrate is etched away with a chemical solution. Thereafter, the substrate is delivered by the feed mechanism 215 into one of the pure water cleaning and drying units 205, 206 where the substrate is cleaned and dried.

The cleaned and dried substrate is introduced by the feed mechanism 215 into one of the annealing units 203, 204 where the substrate is annealed forcibly with heat. The annealed substrate is then brought by the feed mechanism 215 into a cassette in the unloading unit 202, from which the substrate will be delivered to a next process.

Details of the units of the plating facility 200 will be described below.

Figure 19:
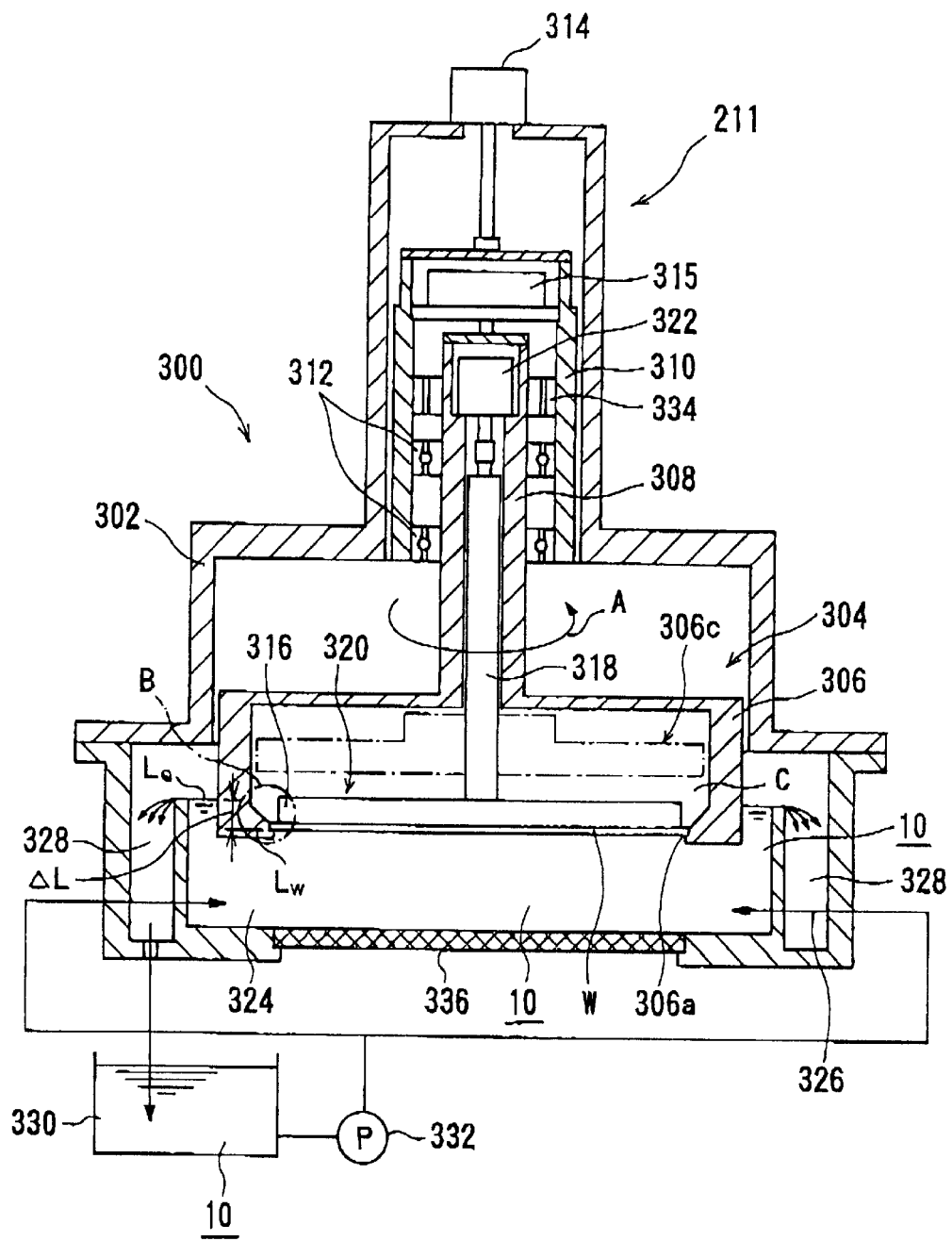
FIG. 19 is a cross-sectional view of a plating unit (plating apparatus) of the plating facility shown in FIG. 18.

FIG. 19 shows the copper plating unit 211. The other copper plating units 212 through 214 are identical in structure to the copper plating unit 211 and will not be described below. As shown in FIG. 19, the copper plating unit 211 has a plating tank 300 including a plating tank housing 302 which houses therein a substrate holder 304 for holding a substrate W. The substrate holder 304 has a substrate holding case 306 and a rotatable shaft 308 that is rotatably supported in a cylindrical guide member 310 by bearings 312, 312. The guide member 310 and the substrate holder 304 are vertically movable a predetermined stroke by a cylinder 314 mounted on the upper end of the plating tank housing 302.

The substrate holder 304 can be rotated in the direction indicated by the arrow A together with the shaft 308 by a motor 315 mounted in an upper portion of the guide member 310. The substrate holder 304 has a space C therein which accommodates a substrate presser 320 that comprises a substrate presser plate 316 and a substrate presser shaft 318. The substrate presser 320 is vertically movable a predetermined stroke by a cylinder 322 mounted in an upper portion of the shaft 308.

Figure 20:
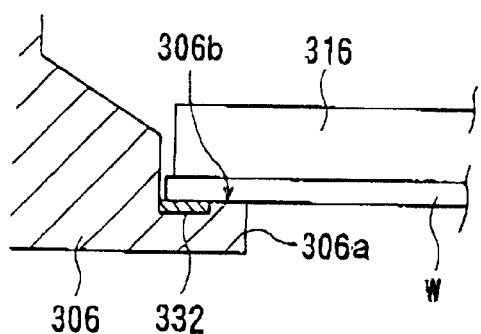
FIG. 20 is an enlarged fragmentary cross-sectional view of an encircled portion B shown in FIG. 19.

The substrate holding case 306 has a lower opening 306a defined therein which communicates with the space C. As shown in FIG. 20, the substrate holding case 306 has a step 306b extending around an upper portion of the lower opening 306a for placing the outer circumferential edge of the substrate W thereon. When the outer circumferential edge of the substrate W is placed on the step 306b and the upper surface of the substrate W is pressed by the substrate presser plate 316, the outer circumferential edge of the substrate W is sandwiched between the substrate presser plate 316 and the step 306b. The lower surface to be plated of the substrate W is exposed in the lower opening 306a. FIG. 20 shows an enlarged fragmentary cross-sectional view of an encircled portion B shown in FIG. 19.

A plating chamber 324 is disposed below the substrate holder 304 in the plating tank housing 302, i.e., below the surface to be plated of the substrate W that is exposed in the lower opening 306a. The plating solution 10 is ejected from a plurality of plating solution ejector pipes 326 toward the center of the plating chamber 324. The plating chamber 324 is surrounded by a retrieval channel 328 for retrieving the plating solution 10 that has overflowed the plating chamber 324.

The plating solution 10 retrieved by the retrieval channel 328 returns to a plating solution storage tank 330. The plating solution 10 in the plating solution storage tank 330 is delivered by a pump 332 to the plating solution ejector pipes 326, which eject the plating solution 10 horizontally radially inwardly into the plating chamber 324. The plating solution 10 that has been introduced horizontally radially inwardly into the plating chamber 324 is turned into a uniform vertical flow applied to the surface of the substrate W to be plated when the substrate W is rotated. The plating solution 10 that has overflowed from the plating chamber 324 is retrieved by the retrieval channel 328, from which the plating solution 10 flows into the plating solution storage tank 330. Therefore, the plating solution 10 circulates between the plating chamber 324 and the plating solution storage tank 330.

The level $L_Q$ of the plating solution 10 in the plating chamber 324 is higher than the level $L_W$ of the plating solution 10 on the surface to be plated of the substrate W by a small distance $\Delta L$. Therefore, the entire surface to be plated of the substrate W contacts the plating solution 10.

An electrical contact 332 (see FIG. 20) for electrically contacting an electric conductor on the substrate W is disposed in the step 306b of the substrate holding case 306. The electrical contact 332 is connected to the negative electrode of an external electric power supply by a brush 334. An anode plate 336 connected to the positive electrode of the external electric power supply is disposed in the bottom of the plating chamber 324 so as to face the substrate W. The substrate holding case 306 has a substrate removable slot 306c defined in a side wall thereof. The substrate W can be inserted into and removed from the substrate holding case 306 via the substrate removal slot 306c by a substrate loading and unloading member such as a robot arm, for example.

The copper plating unit 211 operates as follows: The cylinder 314 is operated to lift the substrate holder 304 together with the guide member 310 by a predetermined distance, and the cylinder 322 is operated to lift the substrate presser 320 to a position where the substrate presser plate 316 is located above the substrate removal slot 306c. The substrate loading and unloading member such as a robot arm is then actuated to introduce the substrate W through the substrate removal slot 306c into the space C in the substrate holder 304, and place the substrate W on the step 306b such that the lower surface to be plated of the substrate W faces downwardly. The cylinder 322 is operated to lower the substrate presser plate 316 until its lower surface abuts against the upper surface of the substrate W, thereby sandwiching the outer circumferential edge of the substrate W between the substrate presser plate 316 and the step 306b.

The cylinder 314 is operated to lower the substrate holder 304 together with the guide member 310 until the lower surface to be plated of the substrate W contacts the plating solution 10, i.e., until the lower surface to be plated of the substrate W reaches the position that is lower than the level $L_Q$ of the plating solution 10 by the distance $\Delta L$. At this time, the motor 315 is energized to rotate the substrate holder 304 and the substrate W at a low speed while they are being lowered. The plating chamber 324 is filled with the plating solution 10. When a predetermined voltage is applied between the anode plate 336 and the electric contact 332 by the external electric power supply, a plating electric current flows from the anode plate 336 to the substrate W, forming a plated film on the lower surface of the substrate W.

During the plating process, the motor 315 is continuously energized to rotate the substrate holder 304 and the substrate W at low speed. The speed at which the substrate holder 304 and the substrate W are rotated is selected in order to form a plated film of uniform thickness on the lower surface of the substrate W without disturbing the vertical flow of the plating solution in the plating chamber 324.

After the plating process is finished, the cylinder 314 is operated to lift the substrate holder 304 and the substrate W. When the lower surface of the substrate holding case 306 reaches a position higher than the level $L_Q$ of the plating solution 10, the motor 315 is energized to rotate at a higher speed to spin off the plating solution from the lower surface of the substrate W and the lower surface of the substrate holding case 306 under centrifugal forces. Thereafter, the cylinder 322 is operated to lift the substrate presser plate 316 to release the substrate W, which remains placed on the step 306b of the substrate holding case 306. Then, the substrate loading and unloading member such as a robot arm is introduced through the substrate removal slot 306c into the space C in the substrate holder 304, holds the substrate W, and removes the substrate W through the substrate removal slot 306c out of the substrate holder 304.

Figure 21:
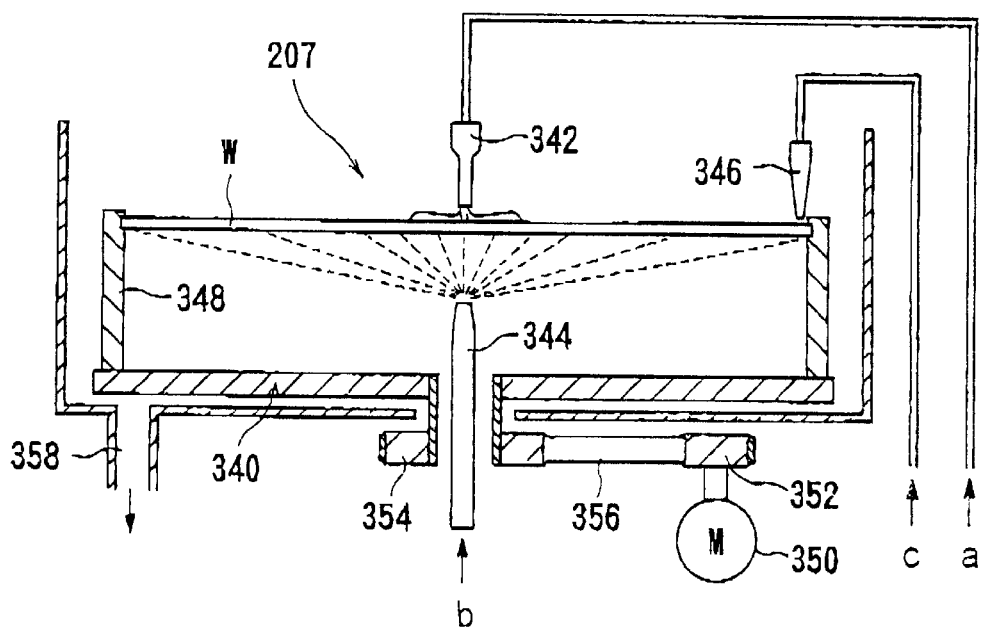
FIG. 21 is a cross-sectional view of a chemical cleaning and outer circumferential etching unit of the plating facility shown in FIG. 18.

FIG. 21 shows the chemical cleaning and outer circumferential etching unit 207. The chemical cleaning and outer circumferential etching unit 208 is identical in structure to the chemical cleaning and outer circumferential etching unit 207 and will not be described in detail below. The chemical cleaning and outer circumferential etching unit 207 has a rotating mechanism 340 for holding and rotating the substrate W, two cleaning nozzles 342, 344, and an etching nozzle 346.

The rotating mechanism 340 has a plurality of substrate support posts 348, and can be rotated about its own axis by a motor 350 through pulleys 352, 354 and a belt 356 trained therearound. While only two substrate support posts 348 are shown, the rotating mechanism 340 actually has four to eight substrate support posts 348 for holding the outer circumferential edge of the substrate W so as to keep the substrate W horizontal.

The cleaning nozzle 342 is positioned closely to the plated surface of the substrate W, and oriented to eject a chemical cleaning solution "a" at the central area of the plated surface of the substrate W. The chemical cleaning solution "a" ejected from the cleaning nozzle 342 comprises a solution effective to remove metal contamination and particle contamination without etching the plated copper film. For example, the chemical cleaning solution "a" may comprise dilute sulfuric acid, dilute hydrofluoric acid (DHF), or ion water, or a combination of ozone water and dilute hydrofluoric acid or hydrogen peroxide ($H_2O_2$) and dilute hydrofluoric acid for use in a two-stage treatment.

The cleaning nozzle 344 is disposed below the central area of the reverse side of the substrate W, i.e., the surface of the substrate W which is not plated. The cleaning nozzle 344 ejects a chemical cleaning solution "b" in a conical scattering pattern to the reverse side of the substrate W. The chemical cleaning solution "b" comprises a solution capable of removing copper adsorbed by the silicon of the base layer of the substrate W, e.g., a semiconductor wafer. For example, the chemical cleaning solution "b" may comprise dilute sulfuric acid, dilute hydrofluoric acid (DHF), or ion water, or a combination of ozone water and dilute hydrofluoric acid or hydrogen peroxide ($H_2O_2$) and dilute hydrofluoric acid for use in a two-stage treatment.

Figure 22:
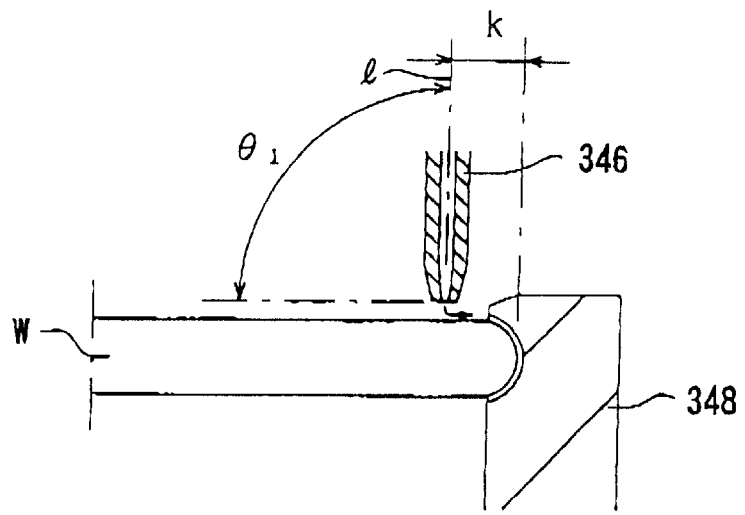
FIG. 22 is a cross-sectional view of an etching nozzle of the plating facility shown in FIG. 18.

As shown in FIG. 22, the etching nozzle 346 has an ejection port spaced from the outer circumferential edge of the substrate W by a distance k of 5 mm or less ($k \leq 5$ mm), and has a central axis "l" oriented perpendicularly to the surface of the substrate W ($\theta 1 = 90°$).

Figure 23:
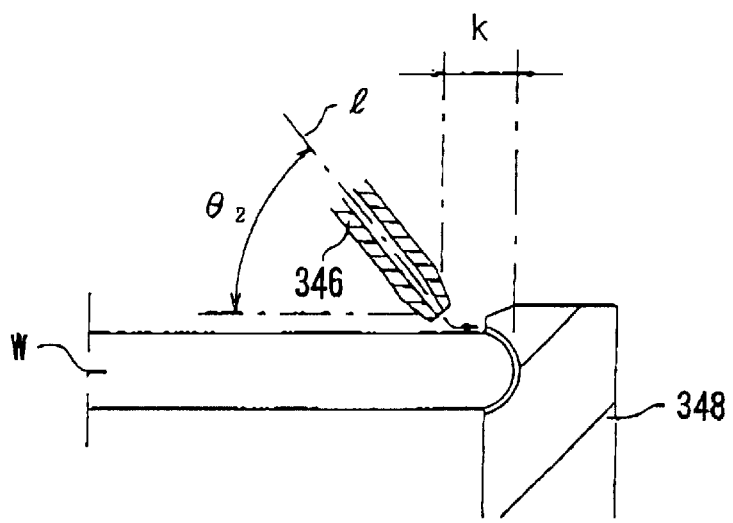
FIG. 23 is a cross-sectional view of an etching nozzle according to another arrangement of the plating facility.

Alternatively, as shown in FIG. 23, the etching nozzle 346 may have an ejection port spaced from the outer circumferential edge of the substrate W by a distance k of 5 mm or less ($k \leq 5$ mm), and have a central axis "l" inclined at an angle $\theta 2$ ($\theta 2 < 90°$) to the surface of the substrate W such that the ejection port is oriented obliquely radially outwardly.

In FIG. 21, the chemical cleaning and outer circumferential etching unit 207 has only one etching nozzle 346. However, the chemical cleaning and outer circumferential etching unit 207 may have a plurality of etching nozzles. The etching nozzle 346 should preferably eject an etching solution "c" as a highly convergent thin jet for producing an etched area with a highly sharp edge. The etching solution "c" ejected from the etching nozzle 346 comprises a solution for etching a thin copper film. For example, the etching solution "c" may comprise a mixture of sulfuric acid and hydrogen peroxide, a mixture of hydrofluoric acid and nitric acid, sodium peroxide, sulfuric acid, nitric acid or ion water, or a combination of ozone water and dilute hydrofluoric acid for use in a two-stage treatment.

Operation of the chemical cleaning and outer circumferential etching unit 207 will be described below. The substrate W which has been plated with copper is held by the substrate support posts 348 with the plated surface facing upwardly, as shown in FIG. 21. Then, the motor 350 is energized to rotate the substrate W. The chemical cleaning solutions "a", "b", are ejected from the cleaning nozzles 342, 344 to the substrate W, and at the same time, the etching solution "c" is ejected from the etching nozzle 346 to the substrate W. Alternatively, the etching solution "c" is initially ejected from the etching nozzle 346 to the substrate W for a predetermined period of time, and thereafter the chemical cleaning solutions "a", "b" are ejected from the cleaning nozzles 342, 344 to the substrate W.

The chemical cleaning solution "a" ejected from the cleaning nozzle 342 is applied to the central area of the plated surface of the substrate W, and spreads over the entire plated surface of the substrate W under centrifugal forces upon rotation of the substrate W. The applied chemical cleaning solution "a" removes metal contamination and particle contamination from the plated surface of the substrate W thereby to clean the plated surface of the substrate W.

The chemical cleaning solution "b" ejected from the cleaning nozzle 344 is applied in a conical scattering pattern to the reverse side of the substrate W, and spreads over the entire reverse surface of the substrate W under centrifugal forces upon rotation of the substrate W. The applied chemical cleaning solution "b" removes metal contamination and particle contamination from the reverse surface of the substrate W thereby to clean the reverse surface of the substrate W.

Figure 24:
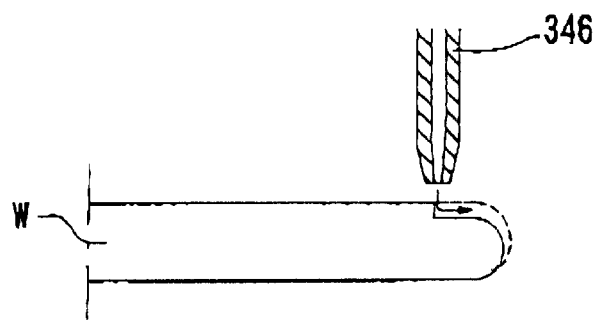
FIG. 24 is a cross-sectional view showing the manner in which a substrate is etched.

The etching solution "c" ejected from the etching nozzle 346 is applied perpendicularly (FIG. 22) or obliquely (FIG. 23) to the plated surface of the substrate W. Since the substrate W is rotating, the etching solution "c" flows outwardly from the applied position under centrifugal forces, and is attached only to the outer circumferential edge of the substrate W. Consequently, as shown in FIG. 24, only the outer circumferential edge of the substrate W is selectively etched by the applied etching solution "c". The selective etching is effective in removing an unwanted thin copper layer, as shown in FIG. 24, which has been attached to the outer circumferential edge of the substrate W by sputtering and an incomplete plated film that has been formed in the plating process. The chemical cleaning solutions "a", "b" and the etching solution "c" which have been applied to the substrate W are drained through a drain port 358 (see FIG. 21).

FIG. 25 shows the pure water cleaning and drying unit 205. Since the pure water cleaning and drying unit 206 is identical in structure to the pure water cleaning and drying unit 205, the pure water cleaning and drying unit 206 will not be described in detail below. The pure water cleaning and drying unit 205 has a rotating mechanism 360 for holding and rotating the substrate W, and two cleaning nozzles 362, 364.

The rotating mechanism 360 has a plurality of substrate support posts 366, and can be rotated about its own axis by a motor 368 through pulleys 370, 372 and a belt 374 trained therearound. While only two substrate support posts 366 are shown, the rotating mechanism 360 actually has four to eight substrate support posts 366 for holding the outer circumferential edge of the substrate W so as to keep the substrate W horizontal. The cleaning nozzles 362, 364 eject pure water "d" in a conical scattering pattern to the upper and lower surfaces of the substrate W.

The pure water cleaning and drying unit 205 operates as follows: The substrate W which has been processed by the chemical cleaning and outer circumferential etching unit 207 or 208 is delivered by the feed mechanism 215 to the pure water cleaning and drying unit 205. In the pure water cleaning and drying unit 205, the outer circumferential edge of the substrate W is gripped by the substrate support posts 366. The motor 368 is energized to rotate the substrate W about its own axis, and at the same time, the pure water "d" is ejected from the cleaning nozzles 362, 364 to clean the upper and lower surfaces of the substrate W. The pure water "d" which has been applied to the substrate W is drained through a drain port 376.

After the upper and lower surfaces of the substrate W have been cleaned by the pure water "d", the motor 368 is energized to rotate the rotating mechanism 360 and the substrate W at a higher speed. The pure water attached to the substrate support posts 366 and the substrate W is scattered around under centrifungal forces, thereby drying the substrate W.

Figure 26:
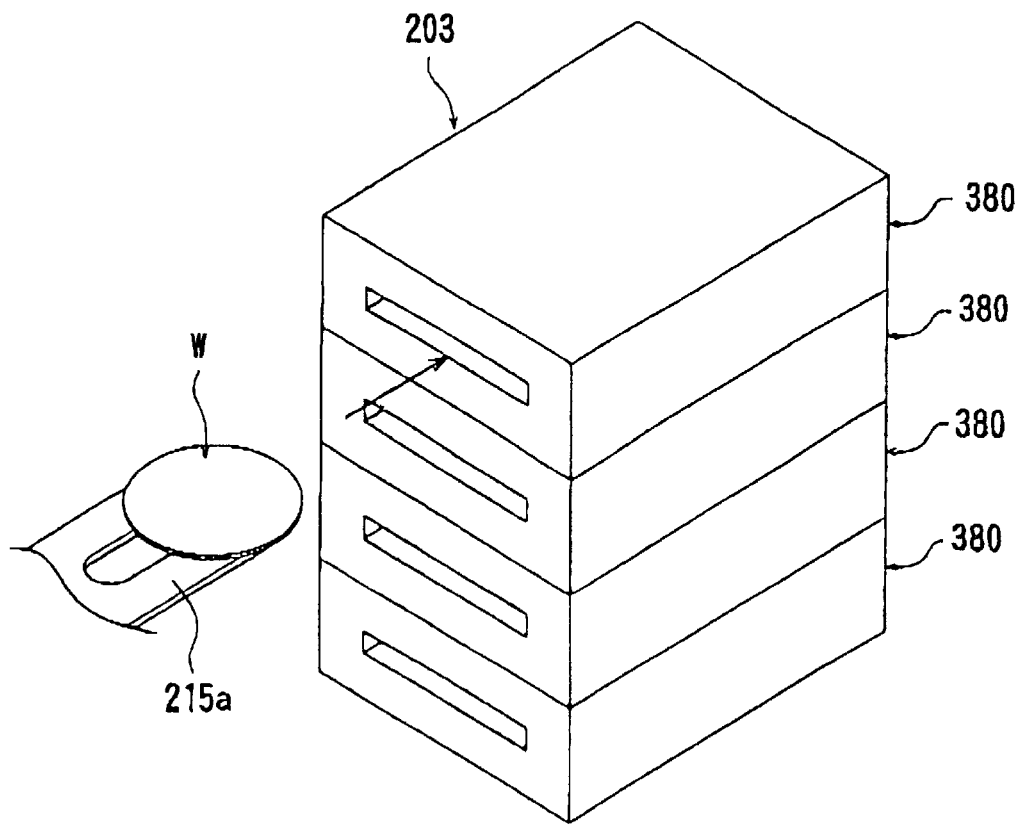
FIG. 26 is a perspective view of an annealing unit of the plating facility shown in FIG. 18.
Figure 27:
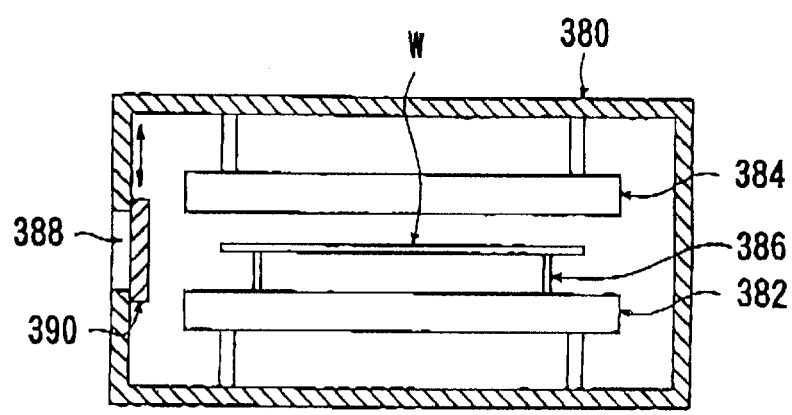
FIG. 27 is a vertical cross-sectional view of a heating furnace of the annealing unit shown in FIG. 26.

FIG. 26 shows a perspective view of an annealing unit 203 of the plating facility, and FIG. 27 shows a vertical cross-sectional view of a heating furnace of the annealing unit 204. The annealing unit 304 is identical in structure to the annealing unit 203, and will not be described in detail below. As shown in FIG. 26, the annealing unit 203 comprises a plurality of (four in the illustrated embodiment) vertically stacked heating furnaces 380. As shown in FIG. 27, each of the heating furnaces 380 has two vertically spaced heaters 382, 384. A plurality of pins 386 for placing the substrate W thereon are mounted on an upper surface of the lower heater 382. In the illustrated embodiment, the heaters 382, 384 apply radiant heat to the substrate W that is positioned therebetween. However, each of the heating furnaces 380 may comprise a hot-plate heating structure for placing the substrate W directly on a heated plate.

Each of the heating furnaces 380 has a loading and unloading slot 388 defined in a front wall thereof for loading the substrate W into and unloading the substrate W from the heating surface 380, and a shutter 390 is disposed in the heating furnace 380 for selectively opening and closing the loading and unloading slot 388.

The annealing unit 203 operates as follows: The substrate W which has been processed by the pure water cleaning and drying unit 205 or 206 is introduced by a hand 215a of the feed mechanism 215 into the heating furnace 380 through the loading and unloading slot 388, and placed on the pins 386. Then, the substrate W is heated to a predetermined temperature and annealed by the heaters 382, 384. The annealed substrate W is unloaded from the heating furnace 380 through the loading and unloading slot 388 by the hand 215a.

The substrate W is annealed in a temperature range from 70° to 90° C. under normal pressure for a period of time ranging from 5 to 30 minutes. If the substrate W is annealed in an $N_2$ atmosphere containing $H_2$, then the surface of the plated copper film is prevented from being oxidized. Under a reduced pressure ranging from 1 to $10^{-6}$ torr, the substrate W may be annealed in a temperature range from 250° to 350° C. for a period of time ranging from 5 to 30 minutes. In an in-line annealing process, the substrate W may be annealed profitably at a low temperature in view of the size of the annealing unit 203 and the heat discharge.

The above structural details of the copper plating unit 211, the chemical cleaning and outer circumferential etching unit 207, the pure water cleaning and drying unit 205, and the annealing unit 23 are given for illustrative purpose only. The various units of the plating facility according to the present invention are not limited to the illustrated details. Stated otherwise, the copper plating units, the chemical cleaning and outer circumferential etching units, the pure water cleaning and drying units, and the annealing units may be of any specific structural details if they can perform their functions.

Although certain preferred embodiments of the present invention have been shown and described in detail, it should be understood that various changes and modifications may be made therein without departing from the scope of the appended claims.

What is claimed is:

1. A plating facility comprising:
    a plating unit for plating a surface of a substrate having interconnection grooves and holes defined therein;
    a cleaning unit for cleaning the substrate after the substrate is plated by said plating unit; and
    an annealing unit for heating the substrate thereby to anneal the substrate after the substrate is cleaned by said cleaning unit, said annealing unit being operable to heat the plated and cleaned substrate at a temperature in a range of 70° C. to 90° C. under atmospheric pressure for a period of time in a range of 5 minutes to 30 minutes so as to stabilize a plated film formed on the substrate.

2. A plating facility according to claim 1, further comprising:
    an etching unit disposed between said plating unit and said cleaning unit, for etching away, with a chemical solution, a seed film and/or a thin plated film on an outer circumferential edge of said substrate after the substrate is plated by said plating unit.

3. A plating facility according to claim 2, wherein said annealing unit comprises means for annealing one substrate at a time.

4. A plating facility according to claim 1, wherein said annealing unit comprises means for annealing one substrate at a time.

5. A plating facility according to claim 1, wherein said annealing unit is operable to develop an annealing atmosphere for annealing the substrate, said annealing atmosphere comprising an $N_2$ atmosphere containing $H_2$.

6. A plating facility comprising:
    a plating unit for plating a surface of a substrate having interconnection grooves and holes defined therein;
    a cleaning unit for cleaning the substrate after the substrate is plated by said plating unit; and an annealing unit for heating the substrate so as to anneal the substrate after the substrate is cleaned by said cleaning unit, said annealing unit being operable to heat the plated and cleaned substrate at a temperature in a range of 250° C. to 350° C. under a pressure in a range of 1 torr to $10^{-6}$ torr for a period of time in a range of 5 minutes to 30 minutes so as to stabilize a plated film formed on the substrate.

7. A plating facility according to claim 6, further comprising:

an etching unit arranged between said plating unit and said cleaning unit, said etching unit being operable to etch away at least one of a seed film and a thin plated film on an outer circumferential edge of the substrate using a chemical solution after the substrate is plated by said plating unit.

8. A plating facility comprising:

a plating unit for plating a surface of a substrate having interconnection grooves and holes defined therein;

a cleaning unit for cleaning the substrate after the substrate is plated by said plating unit; and an annealing unit for annealing the substrate after the substrate is cleaned by said cleaning unit, said annealing unit comprising a plurality of vertically-stacked heating furnaces.

9. A plating facility according to claim 8, wherein each of said heating furnaces is operable to generate an oxidation preventing atmosphere in an interior thereof.

10. A plating facility according to claim 9, wherein said oxidation preventing atmosphere comprises an $N_2$ atmosphere containing $H_2$.

11. A plating facility comprising:

a plating unit for plating a surface of a substrate having interconnection grooves and holes defined therein;

a cleaning unit for cleaning the substrate after the substrate is plated by said plating unit; and an annealing unit for annealing the substrate after the substrate is cleaned by said cleaning unit, said annealing unit comprising a heating furnace including at least two vertically-spaced heaters therein.

12. A plating facility according to claim 11, wherein said heaters are operable to apply radiant heat to the substrate.

13. A plating facility according to claim 11, wherein said heating furnace is operable to generate an oxidation preventing atmosphere in an interior thereof.

14. A plating facility according to claim 13, wherein said oxidation preventing atmosphere comprises an $N_2$ atmosphere containing $H_2$.

15. A plating facility comprising:

a plating unit for plating a surface of a substrate having interconnection grooves and holes defined therein;

a cleaning unit for cleaning the substrate after the substrate is plated by said plating unit; and an annealing unit for annealing a plurality of substrates cleaned by said cleaning unit, said annealing unit comprising a plurality of vertically-stacked heating furnaces, each of said heating furnaces being operable to anneal one substrate at a time.

16. A plating facility according to claim 15, wherein said heating furnace is operable to generate an oxidation preventing atmosphere in an interior thereof.

17. A plating facility according to claim 16, wherein said oxidation preventing atmosphere comprises an $N_2$ atmosphere containing $H_2$.

* * * * *